(12) United States Patent
Ohnishi et al.

(10) Patent No.: US 7,525,324 B2
(45) Date of Patent: Apr. 28, 2009

(54) INSPECTION METHOD, INSPECTION APPARATUS, AND POLARIZATION METHOD FOR PIEZOELECTRIC ELEMENT

(75) Inventors: Takao Ohnishi, Kiyosu (JP); Tomohiro Yamada, Kasugai (JP); Takatoshi Nehagi, Seto (JP)

(73) Assignee: NGK Insulators, Ltd., Nagoya-City (JP)

( * ) Notice: Subject to any disclaimer, the term of this patent is extended or adjusted under 35 U.S.C. 154(b) by 0 days.

(21) Appl. No.: 11/856,351

(22) Filed: Sep. 17, 2007

(65) Prior Publication Data

US 2008/0030102 A1    Feb. 7, 2008

Related U.S. Application Data

(63) Continuation of application No. PCT/JP2006/305906, filed on Mar. 17, 2006.

(30) Foreign Application Priority Data

| Mar. 18, 2005 | (JP) | ............................. 2005-078645 |
| Jun. 29, 2005 | (JP) | ............................. 2005-189326 |
| Nov. 15, 2005 | (JP) | ............................. 2005-330589 |

(51) Int. Cl.
   *G01R 29/22* (2006.01)
(52) U.S. Cl. .................. 324/727; 310/313 R; 310/358; 324/718; 438/3
(58) Field of Classification Search ................. 324/727, 324/109, 522, 537; 367/180; 29/25.35
See application file for complete search history.

(56) References Cited

U.S. PATENT DOCUMENTS

| 4,644,259 | A | | 2/1987 | Boser |
| 5,447,051 | A | * | 9/1995 | Hanks et al. .................. 73/1.15 |
| 5,568,055 | A | * | 10/1996 | Olsen .......................... 324/718 |
| 6,208,063 | B1 | * | 3/2001 | Horikawa et al. ....... 310/313 R |
| 6,556,028 | B1 | * | 4/2003 | Umanskiy et al. ........... 324/727 |
| 2004/0132221 | A1 | * | 7/2004 | Kobayashi et al. ............. 438/3 |
| 2004/0232803 | A1 | * | 11/2004 | Matsushita et al. .......... 310/358 |

FOREIGN PATENT DOCUMENTS

| EP | 0 180 277 B1 | 9/1989 |
| JP | 61-108956 A1 | 5/1986 |
| JP | 61-268085 A1 | 11/1986 |
| JP | 06-003305 A1 | 1/1994 |
| JP | 06-018462 A1 | 1/1994 |
| JP | 08-250780 A1 | 9/1996 |

(Continued)

*Primary Examiner*—Timothy J Dole
*Assistant Examiner*—Benjamin M Baldridge
(74) *Attorney, Agent, or Firm*—Burr & Brown

(57) ABSTRACT

A method for inspecting a piezoelectric element includes first-inspection-signal application step of applying to the piezoelectric element a first inspection signal Vp(1) having a first predetermined voltage waveform; first-characteristic-value measurement step of measuring, as a first characteristic value, an electrical characteristic value of the piezoelectric element after application of the first inspection signal; second-inspection-signal application step of applying to the piezoelectric element a second inspection signal Vp(2) having a second predetermined voltage waveform and an electrical power greater than that of the first inspection signal; second-characteristic-value measurement step of measuring, as a second characteristic value, the electrical characteristic value of the piezoelectric element after application of the second inspection signal; and anomaly determination step of determining whether or not the piezoelectric element is anomalous on the basis of a value corresponding to the difference between the measured second characteristic value and the measured first characteristic value.

20 Claims, 12 Drawing Sheets

FOREIGN PATENT DOCUMENTS

| | | | |
|---|---|---|---|
| JP | 2584093 B2 | 11/1996 |
| JP | 2682473 B2 | 8/1997 |
| JP | 2001-033415 A1 | 2/2001 |
| JP | 2002-207019 A1 | 7/2002 |
| JP | 2004-296784 A1 | 10/2004 |
| JP | 2005-057555 A1 | 3/2005 |

* cited by examiner

INSPECTION METHOD, INSPECTION APPARATUS, AND POLARIZATION METHOD FOR PIEZOELECTRIC ELEMENT

TECHNICAL FIELD

The present invention relates to a method and an apparatus for inspection on whether or not a piezoelectric element is anomalous, and to a polarization method for polarizing a piezoelectric element.

BACKGROUND ART

A piezoelectric element (in the present specification, the term "piezoelectric element" encompasses "electrostrictive element") is an element (device) which contracts or expands upon application of voltage thereto or an element which generates a voltage when it is contracted or expanded. Therefore, such a piezoelectric element is used in various apparatuses; for example, as a drive actuator of an ink injection device of a printer or the like, or as a sensor for measuring viscosity of fluid or the like.

If an anomaly such as generation of a micro crack occurs in such a piezoelectric element, the piezoelectric element cannot provide a desired function. In view of this, in manufacture of piezoelectric elements, inspection is performed so as to determine whether or not an anomaly such as generation of a micro crack has occurred in a manufactured piezoelectric element or to determine whether or not a manufactured piezoelectric element is likely to have such an anomaly later.

Conventionally, such inspection has been performed through, for example, a method of measuring the frequency characteristic of impedance of a manufactured piezoelectric element, and comparing a curve pattern representing the measured impedance frequency characteristic with a curve pattern representing the frequency characteristic of impedance of a piezoelectric element which is normal and serves as a reference for comparison (hereinafter referred to as a "reference piezoelectric element") (see, for example, Japanese Patent Application Laid-Open (kokai) No. H6-3305).

DISCLOSURE OF THE INVENTION

However, individual differences are present among manufactured piezoelectric elements. Therefore, in accordance with the above-described conventional inspection method, in a case where a manufactured piezoelectric element itself is not anomalous but its characteristics deviate from those of a reference piezoelectric element, there may be made an erroneous determination that "the manufactured piezoelectric element is anomalous." Erroneous determination stemming from such deviation in characteristics can be avoided by making the determination criterion less strict such that a determination that "the manufactured piezoelectric element is normal" is made even when the two above-mentioned curve patterns differ from each other to some degree. However, in such a case, a piezoelectric element which is actually anomalous is erroneously determined to be normal.

Accordingly, one of objects of the present invention is to provide an inspection method for a piezoelectric element which can easily determine whether or not the piezoelectric element is anomalous while minimizing the chance of erroneous determination, as well as an apparatus therefor.

In order to achieve the above-object, the present invention provides an inspection method for a piezoelectric element for determining whether or not the piezoelectric element is anomalous, comprising at least:

first-inspection-signal application step of applying to the piezoelectric element a first inspection signal having a first predetermined voltage waveform;

first-characteristic-value measurement step of measuring, as a first characteristic value, an electrical characteristic value of the piezoelectric element after application of the first inspection signal;

second-inspection-signal application step of applying to the piezoelectric element a second inspection signal having a second predetermined voltage waveform and an electrical power greater than that of the first inspection signal;

second-characteristic-value measurement step of measuring, as a second characteristic value, the electrical characteristic value of the piezoelectric element after application of the second inspection signal; and anomaly determination step of determining whether or not the piezoelectric element is anomalous on the basis of a value corresponding to the difference between the measured second characteristic value and the measured first characteristic value.

In this case, desirably, the electrical characteristic value is at least one of, for example, the electric capacitance (electrostatic capacitance), loss, and resonance frequency of the piezoelectric element. Further, the determining whether or not the piezoelectric element is anomalous on the basis of a value corresponding to the difference between the measured second characteristic value and the measured first characteristic value encompasses determining whether or not the piezoelectric element is anomalous on the basis of results of comparison between the magnitude of the second characteristic value and the magnitude of the first characteristic value.

By virtue of this method, a first inspection signal having a first predetermined voltage waveform is firstly applied to a piezoelectric element to be inspected. After that, an electrical characteristic value of the piezoelectric element (e.g., the electric capacitance, loss, resonance frequency, etc. of the piezoelectric element) is measured as a first characteristic value. This first characteristic value is a value peculiar to the piezoelectric element undergoing the inspection (i.e., a value reflecting the "characteristics of the piezoelectric element undergoing the inspection" stemming from individual differences among the manufactured piezoelectric elements).

Next, a second inspection signal having a second predetermined voltage waveform is applied to the piezoelectric element. The electrical power of the second inspection signal is greater than that of the first inspection signal. After that, the electrical characteristic value of the piezoelectric element is measured as a second characteristic value. This second characteristic value is also a value peculiar to the piezoelectric element undergoing the inspection. Accordingly, the value corresponding to the difference between the second characteristic value and the first characteristic value is a value which is free from the influence of the individual differences.

Incidentally, as the electrical power of an inspection signal applied to the piezoelectric element is increased, the polarizability of the piezoelectric element is improved (hereinafter, this may be expressed as "polarization" progressing). Further, as described above, the electrical power of the second inspection signal is greater than that of the first inspection signal. Accordingly, if the piezoelectric element undergoing the inspection has no micro crack after application of the second inspection signal, the second characteristic value will become greater or smaller than the first characteristic value, irrespective of the characteristics peculiar to the piezoelectric element undergoing the inspection stemming from the individual difference. Whether the second characteristic value becomes greater or smaller than the first characteristic value depends on the type of the characteristic value.

That is, for example, in a case where the piezoelectric element contains $(Bi_{0.5}Na_{0.5})TiO_3$ as a main component and the piezoelectric element is normal, the loss after application of the second inspection signal becomes smaller than the loss after application of the first inspection signal; the resonance frequency after application of the second inspection signal becomes greater than the resonance frequency after application of the first inspection signal; and the electric capacitance after application of the second inspection signal becomes smaller than the electric capacitance after application of the first inspection signal, although the behavior described above changes depending on the type of the piezoelectric element undergoing the inspection.

Meanwhile, since the electrical power of the second inspection signal is greater than that of the first inspection signal, if the piezoelectric element already has a micro crack at the time point at which application of the first inspection signal is ended, the micro crack becomes larger during application of the second inspection signal. Further, even in a case where the piezoelectric element has no micro crack at the time point at which application of the first inspection signal is ended, if the piezoelectric element is an anomalous piezoelectric element which easily has a micro crack, a micro crack is generated during application of the second inspection signal.

As a result, when the piezoelectric element undergoing the inspection is not a normal piezoelectric element, the loss after application of the second inspection signal becomes greater than the loss after application of the first inspection signal. Presumably, this phenomenon occurs because generation of a micro crack causes generation of fine cracks in the electrodes of the piezoelectric element, so that the resistances of the electrodes themselves increase by a minute amount. Further, the resonance frequency after application of the second inspection signal becomes lower than the resonance frequency after application of the first inspection signal. This phenomenon occurs because the rigidity of the piezoelectric element decreases due to generation of a micro crack. Furthermore, the electric capacitance after application of the second inspection signal becomes greater than the electric capacitance after application of the first inspection signal. Presumably, this phenomenon occurs because the internal stress condition of the piezoelectric element changes (stress is released) due to generation of a micro crack.

As described above, if the piezoelectric element undergoing the inspection is not normal, the trend of change in magnitude from the first characteristic value to the second first characteristic value becomes reverse to (or is opposite to) the trend of change in magnitude from the first characteristic value to the second first characteristic value for the case where the piezoelectric element undergoing the inspection is normal.

In view of the above, in the anomaly determination step of the present invention, determination as to whether or not the piezoelectric element is anomalous is made on the basis of a value corresponding to the difference between the "first characteristic value, which is the electrical characteristic value of the piezoelectric element after application of the first inspection signal," and the "second characteristic value, which is the electrical characteristic value of the piezoelectric element after application of the second inspection signal." As a result, the determination as to whether or not the piezoelectric element is anomalous can be accurately (or properly, without error) performed without being influenced by variation of the electrical characteristic value due to the individual difference of the piezoelectric element undergoing the inspection.

It should be noted that, each of the first inspection signal and the second inspection signal is set (or desirably set) to have a voltage (the voltage which is defined (or determined) by the maximum voltage value, waveform, application time, etc.) such that when no micro crack is generated in a piezoelectric element upon application of the second inspection signal performed after application of the first inspection signal, the piezoelectric element can be determined to be normal. Further, the resonance frequency may be measured through electrical measurement, or measured by use of a sensor (or sensors) for detecting mechanical displacement, speed, acceleration, etc.

In one aspect of the inspection method of the present invention, preferably, the first predetermined voltage waveform is a voltage waveform composed of a first number of successive basic waveforms, each increasing from zero to a predetermined voltage value and then decreasing from the predetermined voltage value to zero; and the second predetermined voltage waveform is a voltage waveform composed of a second number of the successive basic waveforms (or of a second number of successive second waveforms each including the basic waveform), the second number being larger than the first number.

In this case, the first inspection signal having the first predetermined voltage waveform may be a signal in which a period in which the voltage value is maintained at zero over a first predetermined time is provided between a certain basic waveform and the next basic waveform. In other words, it can be said that a basic waveform contained in the first predetermined voltage waveform is a waveform in which the voltage increases from zero to a predetermined voltage value, decreases from the predetermined voltage value to zero, and then remains at zero over a first predetermined time.

Similarly, the second inspection signal having the second predetermined voltage waveform may be a signal in which a period in which the voltage value is maintained at zero over a second predetermined time is provided between a certain basic waveform and the next basic waveform. In other words, it can be said that a basic waveform contained in the second predetermined voltage waveform is a waveform in which the voltage increases from zero to a predetermined voltage value, decreases from the predetermined voltage value to zero, and then remains at zero over a second predetermined time. The second predetermined time may be equal to the first predetermined time or differ from the first predetermined time. In the case where the second predetermined time differs from the first predetermined time, the second predetermined voltage waveform can be said to be a voltage waveform composed of a second number of successive second waveforms, each of which includes the basic waveform forming the first predetermined voltage waveform, the second number being larger than the first number.

Moreover, it has been found that polarizability of the piezoelectric element rapidly increases (that is, polarization of the piezoelectric element (ferroelectric body) proceeds within a short period of time) when a pulse-shaped voltage signal having a relatively high maximum voltage value is repeatedly applied to the piezoelectric element. Therefore, if an inspection signal having a plurality of basic waveforms each increasing from zero to a predetermined voltage value and then decreasing from the predetermined voltage value to zero is applied to the piezoelectric element as described above, polarization of the piezoelectric element can be quickly progressed. Further, if such an inspection signal is applied, the voltage of each inspection signal frequently increases and decreases at the time of application thereof, so that repeated stress is generated in the piezoelectric element.

In addition, the first predetermined voltage waveform is a voltage waveform formed by successively repeating a basic waveform a first number times, and the second predetermined voltage waveform is a voltage waveform formed by successively repeating the basic waveform or second basic waveforms each including the basic waveform a second number times, the second number being greater than the first number. Therefore, the electrical power of the second inspection signal having the second predetermined voltage waveform is greater than that of the first inspection signal having the first predetermined voltage waveform. Thus, the second inspection signal can apply a larger energy to the piezoelectric element. Accordingly, when the piezoelectric element is not a normal product, the second inspection signal causes a micro crack to grow further and become overt (to cause the electrical characteristic values to change greatly). As a result, the difference between the first and second characteristic values increases, whereby the determination accuracy in the anomaly determination step can be improved.

In this case, preferably, the basic waveform is a voltage waveform in which at least one of an increasing time, which is a time required to increase from zero to the predetermined voltage value, and a decreasing time, which is a time required to decrease from the predetermined voltage value to zero, substantially coincides with (is set to be substantially equal to) the resonance period of the piezoelectric element. Moreover, the increasing time and the decreasing time preferably have the same length and substantially coincide with the resonance period.

The basic waveform is a waveform in which the voltage increases from zero to the predetermined voltage value and then decreases from the predetermined voltage value to zero. Accordingly, when either of the first and second inspection signals each containing a plurality of the basic waveforms is applied to the piezoelectric element, the piezoelectric element displaces (deforms). This displacement attenuates, while vibrating, after the first inspection signal is lost or after the second inspection signal is lost. That is, the piezoelectric element residually vibrates (or has ringing) after application of each inspection signal is ended. Therefore, if the electrical characteristic value (the first characteristic value and the second characteristic value) is measured in a period in which the amplitude of the residual vibration is large, the measurement error becomes large. Accordingly, the first-characteristic-value measurement step and the second-characteristic-value measurement step cannot be started unless the residual vibration attenuates to a certain degree. As a result, the time required to determine anomaly of the piezoelectric element becomes long.

In contrast, when the decreasing time of the basic waveform coincides with the resonance period of the piezoelectric element, residual vibration is less likely to be generated after the application of the inspection signal is ended. Similarly, when the increasing time of the basic waveform coincides with the resonance period of the piezoelectric element, vibration is less likely to be generated during the application of the inspection signal, so that residual vibration is less likely to be generated after the application of the inspection signal is ended. Accordingly, the above-described configuration can reduce the residual vibration, to thereby enable the measurement of the electrical characteristic value to be started within a short period of time after the application of the inspection signal is ended. As a result, the time required to determine anomaly of the piezoelectric element can be shortened. Moreover, in the case where both the increasing time and the decreasing time substantially coincide with the resonance period of the piezoelectric element, the residual vibration can be reduced further. Accordingly, the time required to determine anomaly of the piezoelectric element can be shortened further.

In another aspect of the inspection method of the present invention, preferably, the first predetermined voltage waveform is a voltage waveform whose maximum voltage value is a predetermined first voltage value; and the second predetermined voltage waveform is a voltage waveform whose maximum voltage value is a predetermined second voltage value greater than the first voltage value.

In this aspect, since the maximum voltage value (second voltage value) of the second predetermined voltage waveform is greater than the maximum voltage value (first voltage value) of the first predetermined voltage waveform, if the piezoelectric element already has a micro crack at the time when application of the first inspection signal is ended, the micro crack becomes larger during application of the second inspection signal. Further, even in a case where the piezoelectric element has no micro crack at the time when application of the first inspection signal is ended, if the piezoelectric element is an anomalous piezoelectric element which easily generates a micro crack, a micro crack becomes more likely to be generated during application of the second inspection signal. Thus, because generation of a micro crack in an anomalous piezoelectric element can be rapidly progressed, the difference between the first and second characteristic values can be increased. As a result, the determination accuracy in the anomaly determination step can be improved.

In this case, preferably, the first predetermined voltage waveform is a voltage waveform composed of a plurality of successive first basic waveforms each increasing from zero to the first voltage value and then decreasing from the first voltage value to zero; and the second predetermined voltage waveform is a voltage waveform composed of a plurality of successive second basic waveforms each increasing from zero to the second voltage value and then decreasing from the second voltage value to zero.

When these voltage waveforms are used, the voltage of each inspection signal frequently increases and decreases at the time of application thereof, so that repeated stress is generated in the piezoelectric element. Therefore, if a micro crack is present in the piezoelectric element the micro crack is caused to grow and become overt (the electrical characteristic values are caused to change greatly), through application of such inspection voltage. As a result, more accurate determination can be performed.

In this case as well, a period in which the voltage value is zero over a predetermined time may be provided between a certain first basic waveform and the next first basic waveform and/or between a certain second basic waveform and the next second basic waveform.

Such a first basic waveform is preferably a voltage waveform in which at least one of an increasing time, which is a time required to increase from zero to the first voltage value, and a decreasing time, which is a time required to decrease from the first voltage value to zero, substantially coincides with the resonance period of the piezoelectric element. Moreover, the increasing time and the decreasing time preferably have the same length and substantially coincide with the resonance period.

Similarly, the second basic waveform is preferably a voltage waveform in which at least one of an increasing time, which is a time required to increase from zero to the second voltage value, and a decreasing time, which is a time required to decrease from the second voltage value to zero, substantially coincides with the resonance period of the piezoelectric element. Moreover, the increasing time and the decreasing time preferably have the same length and substantially coincide with the resonance period.

In these cases, because of the reason described above, the residual vibration of the piezoelectric element can be suppressed, so that the time required to determine anomaly of the piezoelectric element can be shortened further.

In these inspection methods, preferably, the value corresponding to the difference between the second characteristic value and the first characteristic value in the anomaly determination step is the difference between the second characteristic value and the first characteristic value or a value obtained by dividing the difference between the second characteristic value and the first characteristic value by the difference between the second voltage value and the first voltage value.

As described above, when determination as to whether or not the piezoelectric element is anomalous is performed on the basis of the difference $\Delta Ch(\Delta Cha=Ch(n)-Ch(n-1))$ between the second characteristic value $Ch(n)$ and the first characteristic value $Ch(n-1)$, a variation of the electrical characteristic value due to the individual difference of the piezoelectric element can be cancelled out, so that accuracy of the determination is improved. Further, when determination as to whether or not the piezoelectric element is anomalous is performed on the basis of a value $Rt(Rt=\Delta Ch/Va)$, which is obtained by dividing the difference $\Delta Ch$ between the second characteristic value $Ch(n)$ and the first electrical characteristic value $Ch(n-1)$ by the difference $Va$ between the second voltage value $V(n)$ and the first voltage value $V(n-1)$, it becomes possible to accurately perform the determination irrespective not only of the individual difference of the piezoelectric element but also of the magnitude of the difference $Va$ of the maximum voltage values of the applied inspection voltages.

Meanwhile, in any of the above-described inspection methods, the electrical characteristic value measured in the first-characteristic-value measurement step and the second-characteristic-value measurement step is preferably at least one of the electric capacitance, loss, and resonance frequency of the piezoelectric element.

Further, preferably, the electrical characteristic value measured in the first-characteristic-value measurement step and the second-characteristic-value measurement step includes the loss and resonance frequency of the piezoelectric element, wherein the anomaly determination step includes:

(1) obtaining a first determination result, which is a result of determination as to whether or not the piezoelectric element is anomalous performed on the basis of a value corresponding to the difference between a loss measured as the second characteristic value and a loss measured as the first characteristic value;

(2) obtaining a second determination result, which is a result of determination as to whether or not the piezoelectric element is anomalous performed on the basis of a value corresponding to the difference between a resonance frequency measured as the second characteristic value and a resonance frequency measured as the first characteristic value; and (3) determining whether or not the piezoelectric element is anomalous on the basis of the first and second determination results.

In this case, since determination on the basis of changes in the loss and resonance frequency can be performed, the frequency (probability of occurrence) of erroneous determination can be reduced.

In the case where the electrical characteristic value includes the loss and resonance frequency of the piezoelectric element as described above, preferably, the loss of the piezoelectric element is measured after measurement of the resonance frequency. That is, preferably, the first-characteristic-value measurement step is a step of measuring the loss of the piezoelectric element after measurement of the resonance frequency of the piezoelectric element, and the second-characteristic-value measurement step is a step of measuring the loss of the piezoelectric element after measurement of the resonance frequency of the piezoelectric element.

The measurement of the resonance frequency of the piezoelectric element in the first-characteristic-value measurement step and the second-characteristic-value measurement step is desirably performed while vibrating the piezoelectric element at different frequencies from a lower limit frequency to an upper limit frequency of a predetermined frequency range.

In order to measure the resonance frequency of the piezoelectric element, the piezoelectric element is vibrated at frequencies from a frequency (lower limit frequency) lower than an expected resonance frequency of the piezoelectric element to a frequency (upper limit frequency) higher than the expected resonance frequency, or from the frequency higher than the expected resonance frequency to the frequency lower than the expected resonance frequency; and a frequency at which the piezoelectric element resonates is obtained as the resonance frequency. Accordingly, since the piezoelectric element is caused to vibrate at a frequency different from the actual resonance frequency at the end of the measurement of the resonance frequency, the residual vibration attenuates quickly. As a result, the measurement of the loss, which is likely to be influenced by the vibration of the piezoelectric element, can be performed within a short period of time from the measurement of the resonance frequency. With this, the time required to determine anomaly of the piezoelectric element can be shortened further.

In addition, preferably, the piezoelectric element inspection method comprises:

a first discharge step of discharging charge from the piezoelectric element after execution of the first-inspection-signal application step and before execution of the first-characteristic-value measurement step; and a second discharge step of discharging charge from the piezoelectric element after execution of the second-inspection-signal application step and before execution of the second-characteristic-value measurement step.

After application of the first inspection signal and after application of the second inspection signal, a charge is accumulated in the piezoelectric element. Accordingly, if the electrical characteristic value (first and second characteristic values) is measured without discharging the charge, the electrical characteristic value changes in accordance with the amount of the accumulated charge. In view of this, as in the above-described method, the first characteristic value is measured after the accumulated charge is discharged after the application of the first inspection signal, and the second characteristic value is measured after the accumulated charge is discharged after the application of the second inspection signal. In this case, each characteristic value can be measured accurately irrespective of the amount of accumulated charge. As a result, the frequency of occurrence of erroneous determination in the anomaly determination step can be lowered.

The piezoelectric element inspected by such an inspection method may be a piezoelectric element fixed to a vibration plate which is a member separate from the piezoelectric element, or a piezoelectric element which is integrated with a vibration plate of zirconia through firing.

The piezoelectric element may be used solely or used in combination with a vibration plate in such a manner that the piezoelectric element is fixed to the vibration plat, or integrated with the vibration plate through firing, such that only one face of the piezoelectric element is exposed to the outside. The inspection method of the present invention can be applied to the piezoelectric element used in such a manner, and can determine whether or not the piezoelectric element is anomalous by merely applying the first and second inspection signals by use of electrodes formed on the piezoelectric element.

Further, an inspection apparatus for a piezoelectric element according to the present invention comprises:

first-inspection-signal application means for applying to the piezoelectric element a first inspection signal having a first predetermined voltage waveform;

first-characteristic-value measurement means for measuring, as a first characteristic value, an electrical characteristic value of the piezoelectric element after application of the first inspection signal;

second-inspection-signal application means for applying to the piezoelectric element a second inspection signal having a second predetermined voltage waveform and an electrical power greater than that of the first inspection signal;

second-characteristic-value measurement means for measuring, as a second characteristic value, the electrical characteristic value of the piezoelectric element after application of the second inspection signal; and anomaly determination means for determining whether or not the piezoelectric element is anomalous on the basis of a value corresponding to the difference between the measured second characteristic value and the measured first characteristic value.

By virtue of the above-configuration, an apparatus for carrying out the above-described inspection method according to the present invention is provided, and determination as to whether or not the piezoelectric element is anomalous can be performed accurately as in the above-described inspection method.

Preferably, the inspection apparatus includes a resistor which is connected to the piezoelectric element in order to discharge charge from the piezoelectric element after the first-inspection-signal application means has applied the first inspection signal but before the first-characteristic-value measurement means measures the electrical characteristic value as the first characteristic value, and to discharge charge from the piezoelectric element after the second-inspection-signal application means has applied the second inspection signal but before the second-characteristic-value measurement means measures the electrical characteristic value as the second characteristic value.

As described above, when the electrical characteristic value (first and second characteristic values) is measured after the charge accumulated in the piezoelectric element is discharged via the resistor after the application of each inspection signal, more accurate electrical characteristic values can be obtained. Accordingly, the determination accuracy of the inspection can be improved.

Incidentally, a conventional process of polarizing a piezoelectric element (process of orienting electric dipoles within a ferroelectric body in a common direction to thereby impart piezoelectric characteristics to the ferroelectric body) is performed through continuous application of a DC voltage (continuous application of a strong DC electric field). However, it has been found that in such a polarization process, a micro crack may be generated in the piezoelectric element in some cases.

Meanwhile, it is found that polarization of a piezoelectric element can be progressed rapidly, if a voltage signal whose voltage increases from zero to a predetermined voltage value and decreases from the predetermined voltage value to zero is repeatedly applied to the piezoelectric element as described above. Accordingly, if this is utilized, the process of polarizing a piezoelectric element can be performed within a short period of time.

That is, a polarization method for a piezoelectric element according to the present invention comprises a step of progressing polarization of the piezoelectric element by applying a pulse-shaped voltage to a piezoelectric element (ferroelectric body) a plurality of times.

In this case, the step of progressing polarization of the piezoelectric element is preferably a step of gradually increasing the magnitude of the pulse-shaped voltage as the number of times of application of the pulse-shaped voltage increases.

When such a polarization method of the present invention is employed, a micro crack is hardly generated during the above-described polarizing process, because of the following presumed reason. Since the applied voltage has a pulse-shaped waveform, the electric dipoles are oriented in a common direction, while stress present within the piezoelectric element is relaxed.

BEST MODE FOR CARRYING OUT THE INVENTION

Embodiments of an inspection method and an inspection apparatus according to the present invention will next be described with reference to the drawings.

(Inspection Apparatus)

Figure 1:
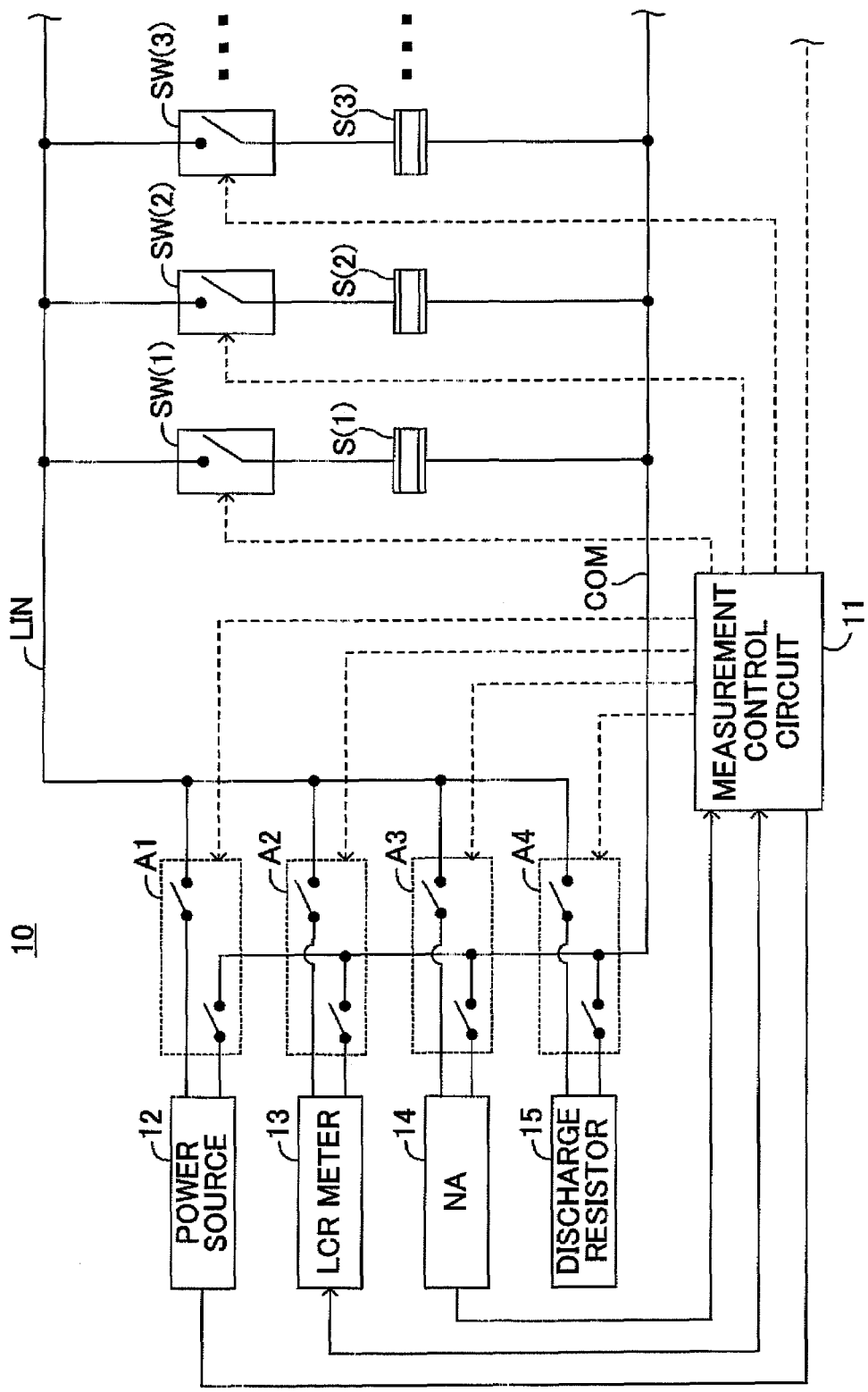
FIG. 1 is a circuit diagram of an inspection apparatus for carrying out an inspection method according to a first embodiment of the present invention.

FIG. 1 is a diagram schematically showing an inspection apparatus 10 for carrying out the inspection method according to the present invention. This inspection apparatus 10 inspects and determines whether or not each of k piezoelectric elements S(1) to S(k) (where k is a natural number) is an anomalous element having a micro crack (or is an anomalous element which is likely to have a micro crack later). As will be described later, the piezoelectric element S(i) (where i is a natural number not greater than k) has an upper electrode and a lower electrode.

The inspection apparatus 10 includes switches A1 to A4, switches SW(1) to SW(k), a measurement control circuit 11, a power source 12, an LCR meter 13, a network analyzer (N. A.) 14, and a discharge resistor 15. The upper electrode of the piezoelectric element S(i) to be inspected is connected to a voltage application line LIN via the switch SW(i). The lower electrode of the piezoelectric element S(i) is connected to a common line COM. Each of the switches A1 to A4 includes two changeover contacts. The two changeover contacts of each of the switches A1 to A4 are simultaneously turned on (closed or connected) or turned off (opened or disconnected) in accordance with an instruction signal from the measurement control circuit 11. Notably, bringing each switch of the switches A1 to A4 into an ON state refers to simultaneously turning on the two changeover contacts of each switch; and bringing each switch into an OFF state refers to simultaneously turning off the two changeover contacts of each switch.

The measurement control circuit 11 is an electrical circuit including a computer. The measurement control circuit 11 is connected to the switches A1 to A4 and the switches SW(1) to SW(k), and supplies to these switches instruction signals for switching the states (on/off states) of the switches. Further, the measurement control circuit 11 is connected to the power source 12, the LCR meter 13, and the network analyzer 14. The measurement control circuit 11 outputs respective instruction signals to the power source 12, the LCR meter 13, and the network analyzer 14, and receives measurement results from the LCR meter 13 and the network analyzer 14.

The power source 12 generates a predetermined inspection voltage to be described later in accordance with the instruction signal from the measurement control circuit 11. One terminal of the power source 12 is connected to the voltage application line LIN via one changeover contact of the switch A1. The other terminal of the power source 12 is connected to the common line COM via the other changeover contact of the switch A1.

The LCR meter 13, which is well known, measures the electric capacitance (electrostatic capacitance) $C(i)$ and loss $D(i)$ of the connected piezoelectric element S(i) in accordance with the instruction signal from the measurement control circuit 11, and sends measurement results to the measurement control circuit 11. One terminal of the LCR meter 13 is connected to the voltage application line LIN via one changeover contact of the switch A2. The other terminal of the LCR meter 13 is connected to the common line COM via the other changeover contact of the switch A2.

The network analyzer 14, which is well known, measures the resonance frequency $fc(i)$ of the connected piezoelectric element S(i) in accordance with the instruction signal from the measurement control circuit 11, and sends measurement results to the measurement control circuit 11. One terminal of the network analyzer 14 is connected to the voltage application line LIN via one changeover contact of the switch A3. The other terminal of the network analyzer 14 is connected to the common line COM via the other changeover contact of the switch A3. The network analyzer 14 applies a drive signal of a predetermined frequency to the connected piezoelectric element S(i) so as to vibrate the piezoelectric element S(i), and measures a signal output from the piezoelectric element S(i). At that time, the network analyzer 14 successively changes the frequency of the drive signal applied to the piezoelectric element S(i) from the lower limit frequency to the upper limit frequency of a range containing an expected resonance frequency of the piezoelectric element S(i). That is, the network analyzer 14 performs frequency sweep. Notably, in place of the network analyzer 14, a known impedance analyzer may be used.

The discharge resistor 15 discharges a charge accumulated in the connected piezoelectric element S(i). One terminal of the discharge resistor 15 is connected to the voltage application line LIN via the switch A4. The other terminal of the discharge resistor 15 is connected to the common line COM via the other changeover contact of the switch A4.

Next, example devices using a piezoelectric element to be inspected will be described.

Figure 2:
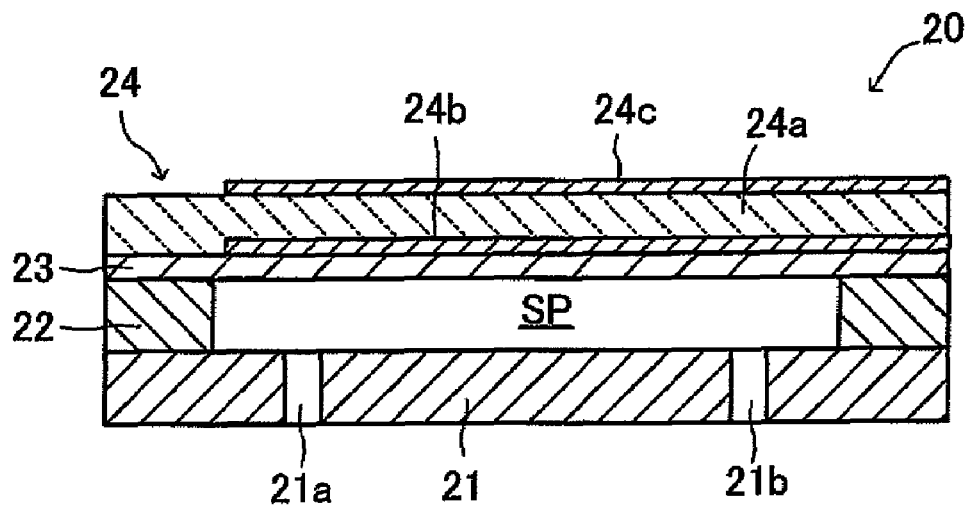
FIG. 2 is a cross sectional view of an example piezoelectric element which is inspected by the inspection method of the present invention.

A first example device 20, whose cross section is shown in FIG. 2, is used as a sensor for measuring viscosity of fluid. The device 20 includes a base plate 21, a frame 22, a vibration plate 23, and a piezoelectric element 24.

The base plate 21 has through-holes 21a and 21b. The frame 22 is disposed on the base plate 21. The vibration plate 23 is disposed on the frame 22. The base plate 21, the frame 22, and the vibration plate 23 are each formed of a zirconia material, and are joined together through integral firing. A cavity SP is formed in a fired body obtained through integral firing. This cavity SP communicates with the outside via the through-holes 21a and 21b.

The piezoelectric element 24 is composed of a piezoelectric body 24a, a lower electrode 24b, and an upper electrode 24c. The lower electrode 24b and the upper electrode 24c face each other while sandwiching a central, thin portion of the piezoelectric body 24a. In actuality, platinum paste is screen-printed on the upper surface of the fired body (the upper surface of the vibration plate 23), and then fired so as to form the lower electrode 24b. Subsequently, a piezoelectric ceramic material in the form of paste is screen-printed to cover the lower electrode 24b and the vibration plate 23, and then fired so as to form the piezoelectric body 24a. Examples of the piezoelectric ceramic material include lead zirconate, lead titanate, and lead magnesium niobium oxide. Finally, platinum paste is screen-printed on the upper surface of the piezoelectric body 24a, and then fired so as to form the upper electrode 24c. As described above, the lower surface of the piezoelectric element 24 is fired integrally with the vibration plate 23 and is not exposed to the outside.

In the case of the device 20, the lower electrode 24b and the upper electrode 24c of the piezoelectric element 24 are connected to unillustrated electrical measurement apparatuses such as an oscillator and an LCR meter. Further, fluid whose viscosity is to be measured is introduced into the cavity SP via the through-holes 21a and 21b. The piezoelectric element 24 is driven by a signal from the oscillator, whereby the vibration plate 23 is vibrated. The viscosity of the fluid to be measured affects the vibration of the vibration plate 23, so that the resonance frequency of the piezoelectric element 24 changes. The device 20 measures the viscosity of the fluid on the basis of this resonance frequency.

Figure 3:
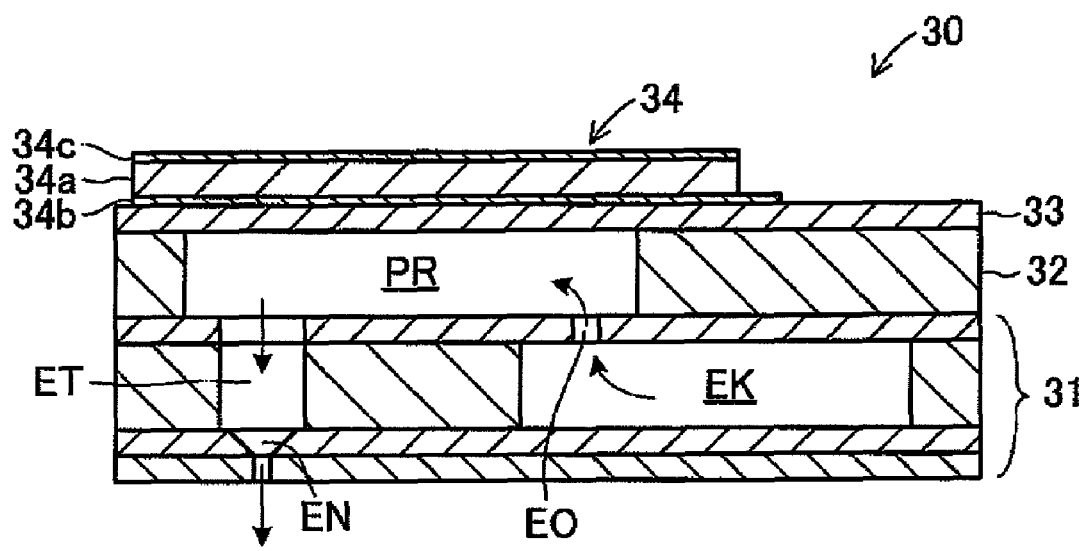
FIG. 3 is a cross sectional view of another example piezoelectric element which is inspected by the inspection method of the present invention.

A second example device 30, whose cross section is shown in FIG. 3, is adapted to inject fluid such as printer ink, liquid material, and liquid fuel. The device 30 includes a liquid discharge member 31, a frame 32, a vibration plate 33, and a piezoelectric element 34.

The liquid discharge member 31 is composed of a plurality of metal plates formed of SUS (stainless steel). These metal plates are joined together by means of adhesive. The liquid discharge member 31 has a liquid supply passage EK, a liquid introduction orifice EO, a liquid discharge passage ET, and a liquid discharge nozzle EN formed therein. Similarly, each of the frame 32 and the vibration plate 33 is a metal plate formed of SUS. The frame 32 is joined to the upper surface of the liquid discharge member 31 by means of adhesive. The vibration plate 33 is joined to the upper surface of the frame 32 by means of adhesive. The upper surface of the liquid discharge member 31, the inner circumferential surface of the frame 32, and the lower surface of the vibration plate 33 define a pressurizing chamber PR. The pressurizing chamber PR communicates with the liquid supply passage EK via the liquid introduction orifice EO, and also communicates with the outside via the liquid discharge passage ET and the liquid discharge nozzle EN.

Like the piezoelectric element 24, the piezoelectric element 34 is composed of a piezoelectric body 34a, a lower electrode 34b, and an upper electrode 34c. The lower electrode 34b and the upper electrode 34c are formed on the lower and upper surfaces, respectively, of the piezoelectric body 34a through firing. The lower surface of the lower electrode 34b is joined to the upper surface of the vibration plate 33 by means of adhesive. As described above, in the device 30, the piezoelectric element 34 is a piezoelectric element fixed to the vibration plate 33, which is a separate member of the piezoelectric element 34, by means of adhesive.

In the case of the device 30, a drive voltage is applied between the lower electrode 34b and the upper electrode 34c of the piezoelectric element 34 so as to expand and contract the piezoelectric element 34 to thereby increase and decrease the volume of the pressurizing chamber PR. Thus, the device 30 introduces fluid to be injected, from the liquid supply passage EK into the pressurizing chamber PR via the liquid introduction orifice EO; pressurizes the liquid within the pressurizing chamber PR; and discharges (injects) the pressurized liquid to the outside via the liquid discharge passage ET and the liquid discharge nozzle EN.

Notably, each of the piezoelectric elements of the devices 20 and 30 has a pair of opposed upper and lower electrodes. However, the devices may be of a type in which a piezoelectric body is sandwiched between a pair of comb-shaped electrodes facing each other.

(First Inspection Method)

Next, a piezoelectric element inspection method (first inspection method) according to a first embodiment of the present invention will be described. In this inspection method, the following steps are successively performed.

(1) Step 1: A predetermined first inspection signal $Vp(1)$ is applied to a piezoelectric element (between the upper and lower electrodes of the piezoelectric element). The first inspection signal $Vp(1)$ is generated by the power source 12.

The first inspection signal $Vp(1)$ applied to the piezoelectric element in Step 1 has a first predetermined voltage waveform. As shown in a time period of t1 to t2 of FIG. 4, the first inspection signal $Vp(1)$ is a voltage signal whose maximum voltage is Vpmax (in the present example, 300 V). The first inspection signal $Vp(1)$ has a generally rectangular voltage waveform (envelope).

Figure 5:
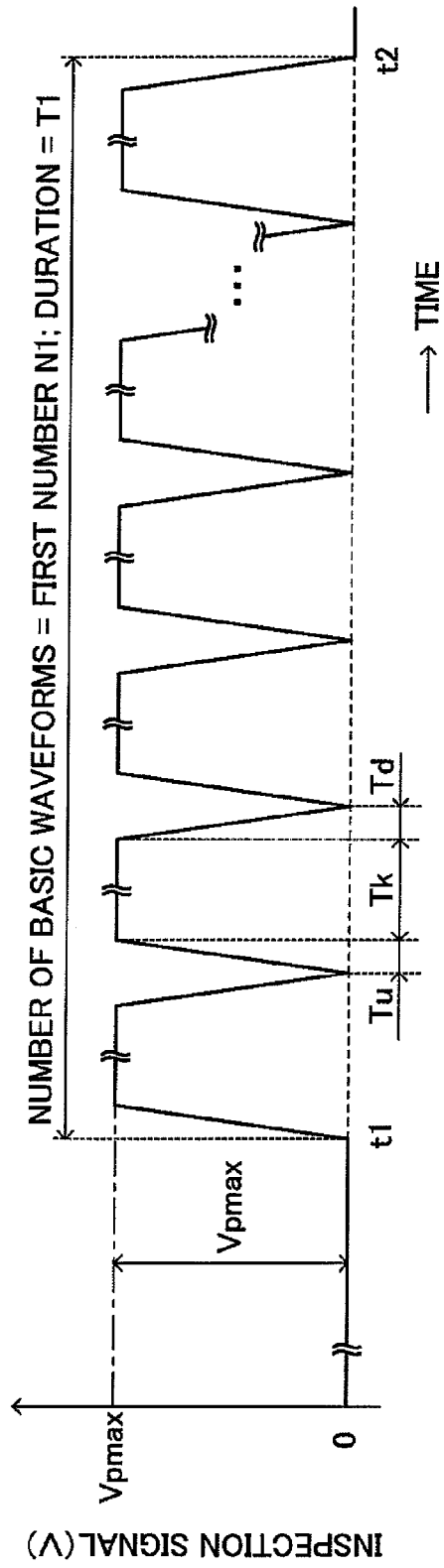
FIG. 5 is an enlarged view of the inspection signal shown in FIG. 4.

In actuality, as shown in FIG. 5, the first inspection signal $Vp(1)$ is a voltage signal which has a waveform composed of a first number N1 of (a plurality of) successive (or successively repeated) trapezoidal waveforms, in each of which the voltage increases from 0 V to the maximum voltage Vpmax over an increasing time (rising time) Tu of several micro seconds, remains at the maximum voltage Vpmax for a keeping time Tk of several tens of micro seconds, and decreases from the maximum voltage Vpmax to 0 V over a decreasing time (falling time) Td of several micro seconds. This trapezoidal waveform will be also referred to as "basic waveform." Accordingly, the first predetermined voltage waveform is a waveform formed by successive N1 basic waveforms. The first inspection signal $Vp(1)$ continues over a first predetermined time $T(1)$. Notably, other inspection signals used in the steps described below differ only in the number of basic waveforms repeatedly generated.

(2) Step 2: Electrical connection is established between the upper and lower electrodes of the piezoelectric element via the discharge resistor 15 for a predetermined discharge time so as to discharge charge accumulated in the piezoelectric element.

(3) Step 3: The electrical characteristic values of the piezoelectric element are measured, and measurement results are stored as $Ch(1)$. In the present example, the electrical characteristic values are electric capacitance (electrostatic capacitance) C, loss D, and resonance frequency fc. The electric capacitance C and the loss D are measured by means of the LCR meter 13. The resonance frequency fc is measured by means of the network analyzer (or impedance analyzer) 14. Measurement is performed such that the resonance frequency fc, the loss D, and the electric capacitance C are measured in this sequence. This measurement sequence is similarly employed in the following measurement performed in the first inspection method. Notably, in actuality, measurement results are stored for each of different types of electrical characteristic values to be measured. That is, the resonance frequency is stored as $fc(1)$, the loss is stored as $D(1)$, and the electric capacitance is stored as $C(1)$. This also applies in the following measurement.

Figure 6:
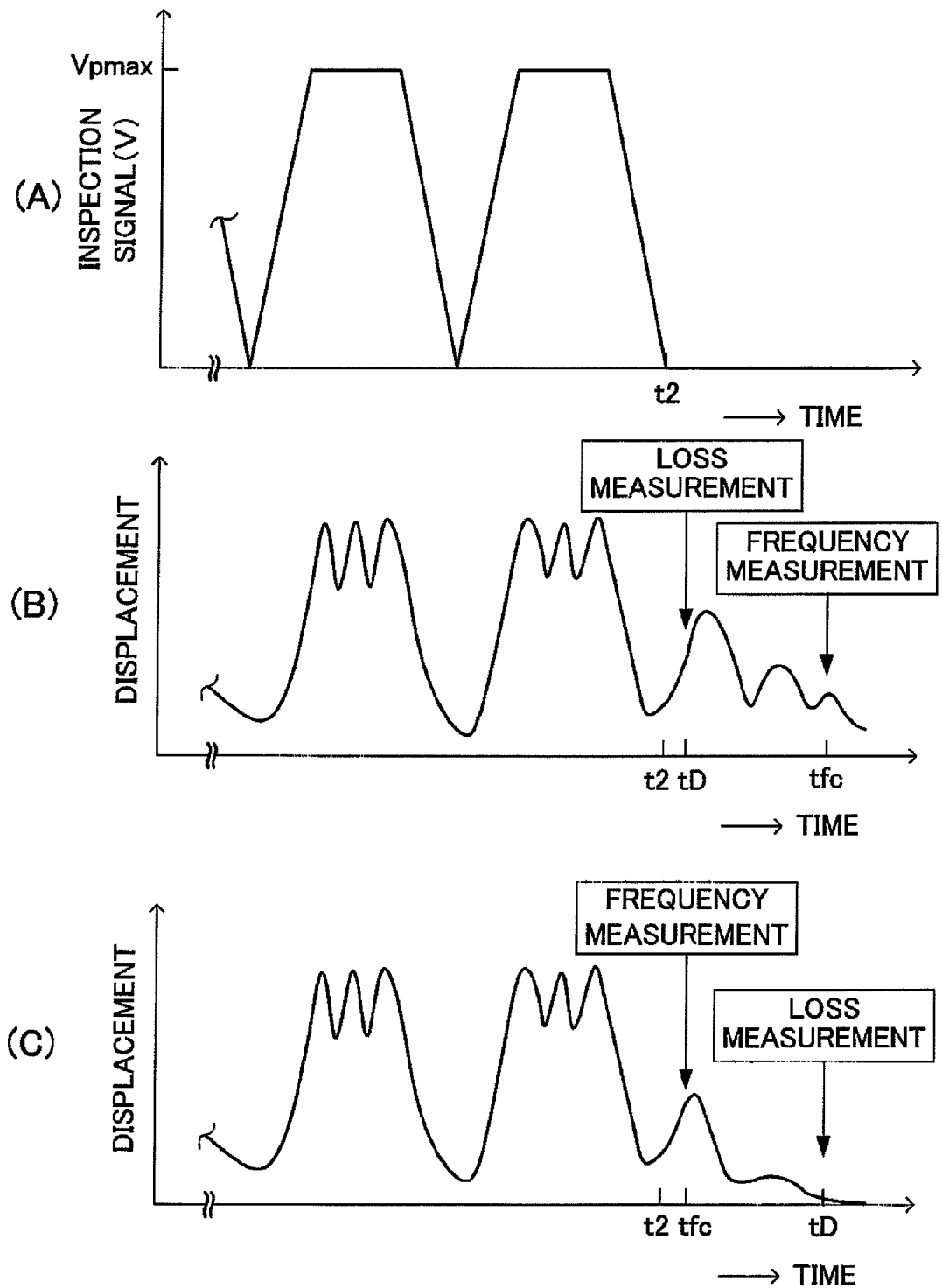
FIG. 6 is a set of time charts showing an inspection signal and displacements of the piezoelectric element.

Here, there will be described the reason why the resonance frequency fc is measured prior to the loss D and the electric capacitance C. FIG. 6 is a set of time charts showing the inspection signal and displacements of the piezoelectric element in the vicinity of time t2 at which application of the first inspection signal is ended (the application is completed).

As shown in section (A) of FIG. 6, before time t2 at which the first inspection signal is lost, the voltage having the basic waveform is repeatedly applied to the piezoelectric element. Therefore, the piezoelectric element repeats extension and contraction, so that the displacement of the piezoelectric element vibrates as shown in sections (B) and (C) of FIG. 6. This vibration remains after time t2. This vibration is called residual vibration (ringing).

In this case, as shown in section (B) of FIG. 6, if the loss D (or the electric capacitance C) is measured at time tD, which is slightly after the time t2, the loss D receives the influence of the vibration, so that the measured value of the loss D differs from the true value. In other words, the measurement error of the loss D increases. Accordingly, in order to reduce the measurement error, the loss D must be measured after such residual vibration attenuates sufficiently. As a result, the time required to measure electrical characteristic values such as the loss D, the electric capacitance C, and the resonance frequency fc becomes long.

In contrast, in the present embodiment, as shown in section (C) of FIG. 6, measurement of the resonance frequency fc (see time tfc) is performed prior to measurement of the loss D. As described above, the resonance frequency fc is determined by the steps of vibrating the piezoelectric element while changing the vibration frequency from a frequency (lower limit frequency) lower than an expected resonance frequency of the piezoelectric element to a frequency (upper limit frequency) higher than the expected resonance frequency, or from the frequency higher than the expected resonance frequency to the frequency lower than the expected resonance frequency, and obtaining, as the resonance frequency fc, a frequency at which the piezoelectric element resonates. Accordingly, since the piezoelectric element is caused to vibrate at a frequency different from the actual resonance frequency fc at the end of the measurement of the resonance frequency, the residual vibration attenuates quickly. As a result, the measurement of the loss D or the electric capacitance C, which are likely to be influenced by the vibration of the piezoelectric element, can be performed within a short time after the measurement of the resonance frequency fc (see time tD). With this, the electrical characteristic values can be accurately measured within a short time, whereby the time required to determine anomaly of the piezoelectric element can be shortened further.

(4) Step 4: At time t3; i.e., upon elapse of a predetermined time (measurement period) Ts after time t2, a second inspection signal Vp(2) is applied to the piezoelectric element. As shown in a time period of t3 to t4 of FIG. 4, the second inspection signal Vp(2) continues over a second predetermined time T(2). The second inspection signal Vp(2) has a second predetermined voltage waveform. The second predetermined voltage waveform is a waveform composed of a second number N2 of the above-described basic waveforms (maximum value=Vp/max). The second number N2 is greater than the first number N1. Accordingly, the electrical power of the second inspection signal Vp(2) is greater than that of the first inspection signal Vp(1).

As described above, in the present inspection method, every time measurement is completed, the next inspection signal is applied to the piezoelectric element, the next inspection signal including basic waveforms, the number of which is greater than that of the previous inspection signal by a predetermined number. That is, if the present time is assumed to be a time point at which an inspection signal for the m-th application is applied, the number N(m) of the basic waveforms contained in the present inspection signal is represented by a function f(m) which monotonously increases with respect to m. Therefore, if an inspection signal for the n-th application is represented as the n-th inspection signal Vp(n), the electrical power of the (n+1)-th inspection signal Vp(n+1) is greater than that of the n-th inspection signal Vp(n).

(5) Step 5: Similar to Step 2, the charge accumulated in the piezoelectric element is discharged.

(6) Step 6: The electrical characteristic values of the piezoelectric element are measured, and measurement results are stored as Ch(2) (i.e., fc(2), D(2), C(2)).

(7) Step 7: Determination as to whether or not the piezoelectric element is anomalous is performed on the basis of the differences $\Delta Ch(=Ch(2)-Ch(1))$ between the electrical characteristic value Ch(2) measured at this time and the electrical characteristic value Ch(1) measured and stored at the previous time.

Specifically, in the case where an electrical characteristic value of interest is an "electrical characteristic value which increases when the piezoelectric element is normal," determination is made as to whether or not the actual difference $\Delta Ch$ is smaller than a predetermined threshold $\Delta Chthm$, which is not greater than 0. When the actual difference $\Delta Ch$ is smaller than the predetermined threshold $\Delta Chthm$ ($\Delta Ch < \Delta Chthm \leq 0$), the piezoelectric element is determined to be anomalous. Meanwhile, in the case where an electrical characteristic value of interest is an "electrical characteristic value which decreases when the piezoelectric element is normal," determination is made as to whether or not the actual difference $\Delta Ch$ is greater than a predetermined threshold $\Delta Chthp$, which is not less than 0. When the actual difference $\Delta Ch$ is greater than the predetermined threshold $\Delta Chthp$ ($\Delta Ch > \Delta Chthp \geq 0$), the piezoelectric element is determined to be anomalous.

Here, Step 7 (anomaly determination step) will be described more specifically. For the sake of convenience of description, the measurement value in Step 3 will be referred to as the first characteristic value, and the measurement value in Step 6 will be referred to as the second characteristic value.

For example, in a case where the piezoelectric element contains $(Bi_{0.5}Na_{0.5})TiO_3$ as a main component, the loss D, the resonance frequency fc, and the electric capacitance C behave as follows, although the behaviors of the loss D, the resonance frequency fc, and the electric capacitance C change depending on the piezoelectric element to be inspected <Behavior of Loss D>

If the piezoelectric element has no micro crack at the time point at which application of the second inspection signal is ended, the loss D decreases after application of the second inspection signal, as compared with that after application of the first inspection signal. That is, since the loss D decreases, the difference $\Delta D(=D(2)-D(1))$ between the loss D(2) after application of the second inspection signal and the loss D(1) after application of the first inspection signal becomes a negative value.

Meanwhile, if the piezoelectric element has a micro crack at the time point at which application of the second inspection signal is ended, the loss D after application of the second inspection signal becomes greater than that after application of the first inspection signal, irrespective of whether the piezoelectric element has already had a micro crack at the time point at which application of the first inspection signal is ended. That is, since the loss D increases, the difference $\Delta D(=D(2)-D(1))$ between the loss D(2) after application of the second inspection signal and the loss D(1) after application of the first inspection signal becomes a positive value. It is presumed that this phenomenon occurs because generation of a micro crack causes generation of fine cracks in the electrodes of the piezoelectric element, so that the resistances of the electrodes themselves increase by a minute amount.

<Behavior of Resonance Frequency fc>

If the piezoelectric element has no micro crack at the time point at which application of the second inspection signal is ended, the resonance frequency fc increases after application of the second inspection signal, as compared with that after application of the first inspection signal. That is, since the resonance frequency increases, the difference $\Delta fc(=fc(2)-fc$ (1)) between the resonance frequency fc(2) after application of the second inspection signal and the resonance frequency fc(1) after application of the first inspection signal becomes a positive value.

Meanwhile, if the piezoelectric element has a micro crack at the time point at which application of the second inspection signal is ended, the resonance frequency fc after application of the second inspection signal becomes lower than that after application of the first inspection signal, irrespective of whether the piezoelectric element has already had a micro crack at the time point at which application of the first inspection signal is ended. That is, since the resonance frequency fc decreases, the difference Δfc(=fc(2)−fc(1)) between the resonance frequency fc(2) after application of the second inspection signal and the resonance frequency fc(1) after application of the first inspection signal becomes a negative value. This phenomenon occurs because generation of a micro crack causes a reduction in rigidity of the piezoelectric element.

<Behavior of Electric Capacitance C>

If the piezoelectric element has no micro crack at the time point at which application of the second inspection signal is ended, the electric capacitance C decreases after application of the second inspection signal, as compared with that after application of the first inspection signal. That is, since the electric capacitance C decreases, the difference ΔC(=C(2)−C(1)) between the electric capacitance C(2) after application of the second inspection signal and the electric capacitance C(1) after application of the first inspection signal becomes a negative value.

Meanwhile, if the piezoelectric element has a micro crack at the time point at which application of the second inspection signal is ended, the electric capacitance C after application of the second inspection signal becomes greater than that after application of the first inspection signal, irrespective of whether the piezoelectric element has already had a micro crack at the time point at which application of the first inspection signal is ended. That is, since the electric capacitance C increases, the difference ΔC(=C(2)−C(1)) between the electric capacitance C(2) after application of the second inspection signal and the electric capacitance C(1) after application of the first inspection signal becomes a positive value. It is presumed that this phenomenon occurs because the internal stress condition of the piezoelectric element changes (stress is released) due to generation of a micro crack.

As described above, if a piezoelectric element undergoing the inspection has a micro crack (that is, the piezoelectric element undergoing the inspection is not normal), the trend of change in magnitude from the first characteristic value to the second characteristic value becomes opposite to the trend of change in magnitude from the first characteristic value to the second characteristic value for the case where the piezoelectric element undergoing the inspection is normal.

Step 7 is an anomaly determination step based on such finding. It should be noted that, in actuality, a determination "the piezoelectric element is anomalous (the piezoelectric element has a micro crack)" is made when at least two of the following three conditions 1 to 3 are satisfied. In the following conditions, a value n is a natural number equal to or greater than 2 and represents the number of times of measurement (the ordinal number of each measurement).

$\Delta D = D(n) - D(n-1) > D\text{th} \geqq 0$    Condition 1

$\Delta fc = fc(n) - fc(n-1) < fc\text{th} \leqq 0$    Condition 2

$\Delta C = C(n) - C(n-1) > C\text{th} \geqq 0$    Condition 3

Notably, when the result of determination as to whether or not Condition 1 is satisfied is referred to as a first determination result; the result of determination as to whether or not Condition 2 is satisfied is referred to as a second determination result; and the result of determination as to whether or not Condition 3 is satisfied is referred to as a third determination result, Step 7 can be said to be a step of obtaining the first through third determination results and determining whether or not the piezoelectric element is anomalous, on the basis of the obtained first through third determination results. By virtue of this step, determination on the basis of changes in loss, resonance frequency, and electric capacitance can be performed, whereby the frequency of occurrence of erroneous determination can be reduced.

Here, description will be continued under the assumption that the piezoelectric element undergoing the inspection is normal. In this case, since the piezoelectric element is determined normal in Step 7, the following Steps 8 to 11 are further carried out.

(8) Step 8: At time t5; i.e., upon elapse of the predetermined time Ts after time t4, a third inspection signal Vp(3) is applied to the piezoelectric element. As shown in a time period of t5 to t6 of FIG. 4, the third inspection signal Vp(3) continues over the second predetermined time T(3). The third inspection signal Vp(3) has a third predetermined voltage waveform. The third predetermined voltage waveform is a waveform composed of a third number N3 of the above-described basic waveforms (maximum value Vpmax). The third number N3 is greater than the second number N2.

(9) Step 9: Similarly to Step 2, the charge accumulated in the piezoelectric element is discharged.

(10) Step 10: The electrical characteristic values of the piezoelectric element are measured, and measurement results are stored as Ch(3) (i.e., fc(3), D(3), C(3)).

(11) Step 11: Determination as to whether or not the piezoelectric element is anomalous is performed on the basis of the difference ΔCh(=Ch(3)−Ch(2)) between the electrical characteristic values Ch(3) measured at this time and the electrical characteristic values Ch(2) measured and stored at the previous time. This determination is performed in a manner similar to that in Step 7.

After this time point, similar steps are repeated until the inspection signal is applied a predetermined number of times (in the present example, 7 times in total) and measurement is performed the predetermined number of times or until a determination that "piezoelectric element is anomalous" is made in mid-course.

That is, the number of basic waveforms contained in the n-th inspection signal Vp(n) is gradually increased from the number (first number) of basic waveforms contained in the first inspection signal Vp(1); the inspection signal Vp(n) is successively applied to the piezoelectric element, then discharging step is carried out; and the electrical characteristic values Ch(n) are measured after the discharge step which is performed after application of the inspection signal Vp(n). Subsequently, determination as to whether or not the piezoelectric element is anomalous is performed on the basis of the differences ΔCh(=Ch(n)−Ch(n−1)) between the electrical characteristic values Ch(n) measured at the present time and the electrical characteristic values Ch(n−1) measured and stored at the previous time.

The electrical characteristic values Ch(n) measured in this manner are values peculiar to a piezoelectric element undergoing the inspection (values reflecting the "characteristics of the piezoelectric element undergoing the inspection" stemming from individual differences among the manufactured piezoelectric elements). However, the electrical characteristic values Ch(n−1) are also values reflecting the "characteristics of the piezoelectric element undergoing the inspection." Therefore, the differences ΔCh are values which are free from the influence of the individual difference of the piezoelectric element. Accordingly, the determination as to whether or not the piezoelectric element is anomalous can be performed accurately.

Here, the above-described basic waveform will be described specifically. As described above, residual vibration remains in the piezoelectric element after completion of application of each inspection signal. Since this residual vibration causes a measurement error in measurement of the electrical characteristic values, the residual vibration is desired to be as small as possible. In view of this, in the present embodiment, the decreasing time (falling time) Td of the basic waveform shown in FIG. 5 is rendered generally equal to the resonance period of the piezoelectric element. The "resonance period of the piezoelectric element" herein refers to the designed resonance period of the piezoelectric element. In the case where the decreasing time (falling time) Td is substantially equal to the resonance period of the piezoelectric element as described above, the residual vibration is less likely to be generated after completion of application of each inspection signal.

In the present embodiment, the increasing time (rising time) Tu of the basic waveform shown in FIG. 5 is also rendered generally equal to the resonance period of the piezoelectric element. In this case, vibration is less likely to be generated in the piezoelectric element during application of the inspection signal. Therefore, the residual vibration is less likely to be generated after completion of application of each inspection signal.

By virtue of the above, the time between completion of application of the inspection time and start of measurement of the electrical characteristic values can be shortened, and thus, the time required to determine whether or not the piezoelectric element is anomalous can be shortened.

(Actual Operation of Inspection Apparatus for Carrying Out the First Inspection Method)

Figure 7:
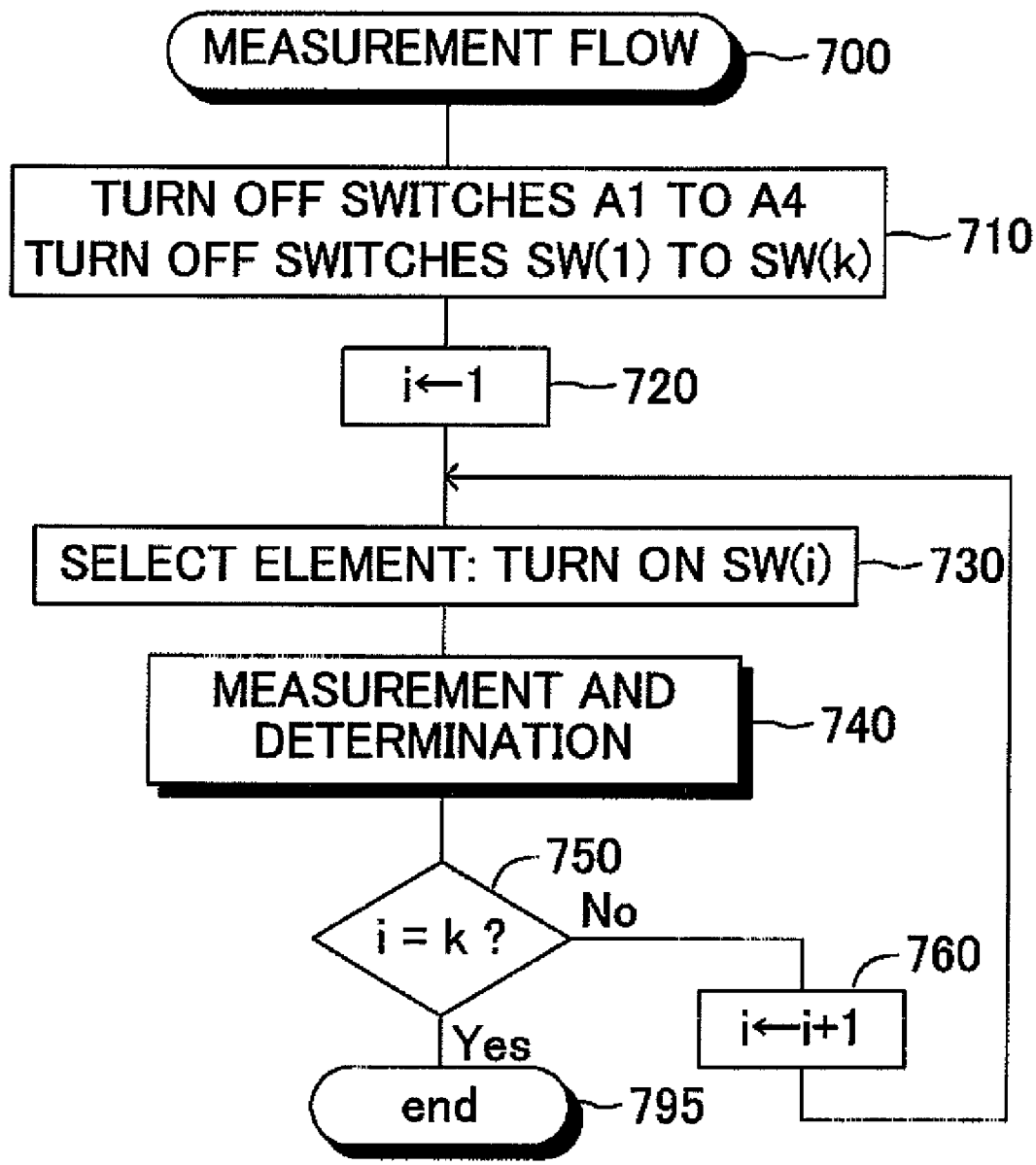
FIG. 7 is a flowchart showing a program executed by a CPU of a measurement control apparatus shown in FIG. 1.
Figure 8:
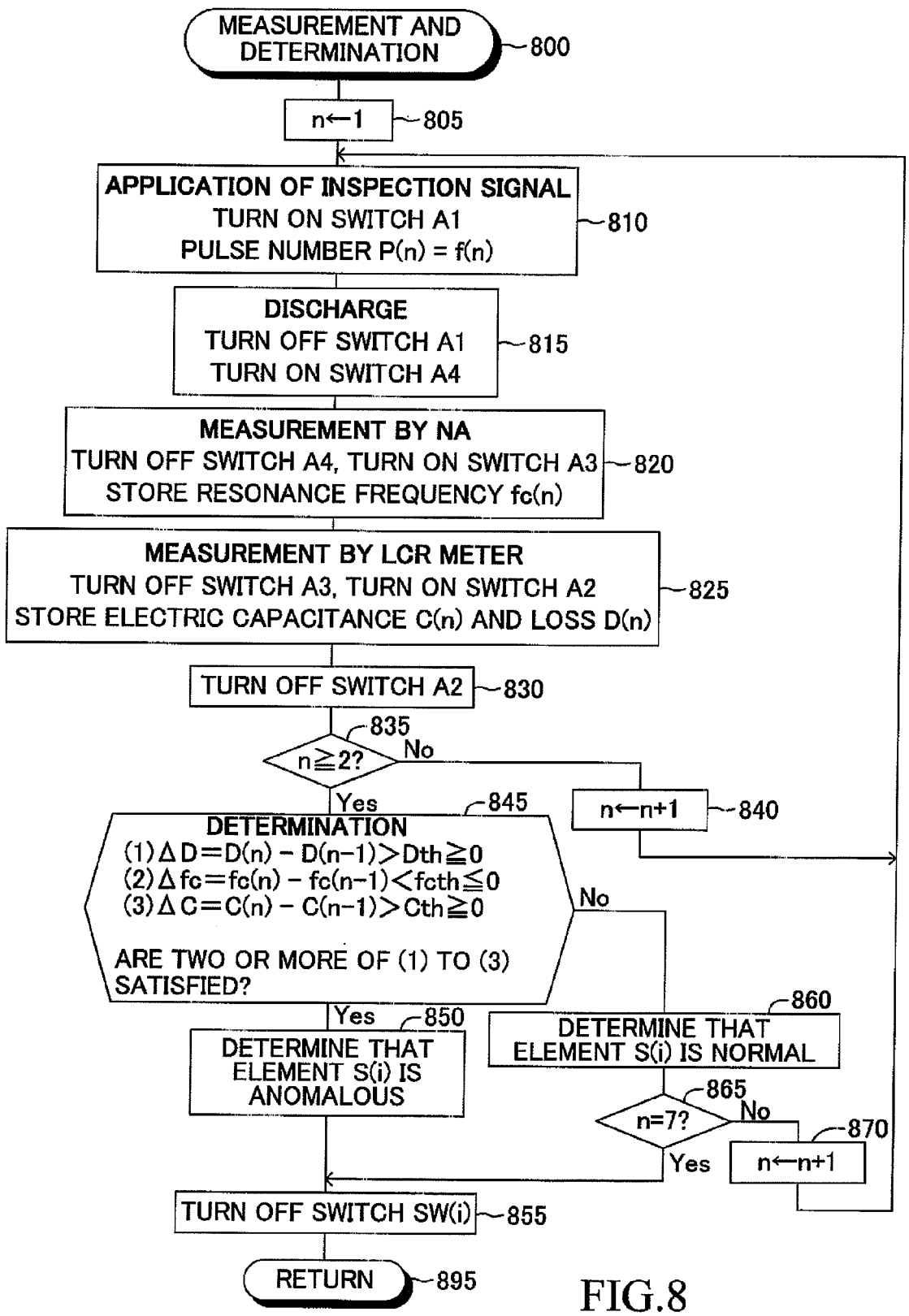
FIG. 8 is a flowchart showing a program executed by the CPU of the measurement control apparatus shown in FIG. 1.

Next, actual operation of an inspection apparatus will be described with reference to FIGS. 7 and 8. FIGS. 7 and 8 are flowcharts showing a program that the CPU of the measurement control circuit 11 executes. It should be mentioned that, in the following description, the total number of piezoelectric elements to be inspected is k (k is a natural number).

First, the CPU starts the processing from Step 700 of FIG. 7, and proceeds to Step 710 so as to brings each of the switches A1 to A4 into an OFF state and brings each of the switches SW(1) to SW(k) into an OFF state. Subsequently, the CPU sets the value of a variable i to "1" in Step 720, and brings the switch SW(i)=SW(1) into an ON state in Step 730, to thereby select the piezoelectric element Si)=S(1) as a piezoelectric element to be inspected.

Next, in Step 740, the CPU performs measurement and determination in accordance with the above-described inspection method. Specifically, the CPU proceeds to Step 805 of FIG. 8 via Step 800 thereof, and sets the value of a variable n to "1." The CPU then performs the processing of the following Steps 810 to 835.

Step 810: The CPU maintains the switch A1 in the ON state over a predetermined time T(n) (in this case, since n=1, T(n)= T(1)). At this time, the CPU instructs the power source 12 to generate P(n) pulses (pulse-shaped voltages) each having the basic waveform (i.e., P(n)=f(n); in this case, since n=1, f(n) f(1)=N1). As a result, the power source 12 generates the first inspection signal Vp(n)=Vp(1) shown in the time period of t1 to t2 of FIGS. 4 and 5. Meanwhile, at the present time point, the switch SW(i)=SW(1) is maintained in the ON state. Accordingly, the inspection signal Vp(n) (in this case, the first inspection signal Vp(1)) generated by the power source 12 is applied to the piezoelectric element S(i)=S(1).

Step 815: The CPU brings the switch A1 into the OFF state, and maintains the switch A4 in the ON state over a predetermined discharge time. This discharge time is set to be shorter than the above-described predetermined time (measurement time) Ts shown in FIG. 4. Thus, the upper and lower electrode of the piezoelectric element S(i)=S(1) are connected via the discharge resistor 15. As a result, the charge accumulated in the piezoelectric element S(i) S(1) is discharged.

Step 820: The CPU brings the switch A4 into the OFF state, and brings the switch A3 into the ON state. As a result, the network analyzer 14 is connected to the piezoelectric element S(i)=S(1). Simultaneously, the CPU causes the network analyzer 14 to measure the resonance frequency fc of the piezoelectric element S(i)=S(1), and stores the measured resonance frequency fc as fc(n)=fc(1).

Step 825: The CPU brings the switch A3 into the OFF state, and brings the switch A2 into the ON state. As a result, the LCR meter 13 is connected to the piezoelectric element S(i) S(1). Simultaneously, the CPU causes the LCR meter 13 to measure the electric capacitance C and loss D of the piezoelectric element S(i)=S(1), and stores the measured electric capacitance C and loss D as C(n)=C(1) and D(n)=D(1), respectively.

Step 830: The CPU brings the switch A2 into the OFF state.

Step 835: The CPU determines whether or not the value of the variable n is equal to or greater than 2. In this case, the value of the variable n is "1." Therefore, the CPU makes a "No" determination in Step 835, and proceeds to Step 840 so as to increase the value of the variable n by "1." Subsequently, the CPU returns to Step 810.

After that, the CPU then performs the processing of the Steps 810 to 830. As a result, the second inspection signal Vp(2) in which the number of the basic waveforms is the second number N2(=P(2)=f(2)) is applied to the piezoelectric element S(i)=S(1), and the electric capacitance C, the loss D, and the resonance frequency fc after discharge are stored as C(2), D(2), and fc(2), respectively.

At this stage, the value of the variable n is 2. Accordingly, the CPU makes a "Yes" determination when it proceeds to Step 835, and then proceeds to Step 845 so as to determine whether or not two or more of the following Conditions 1 to 3 are satisfied.

| | |
|---|---|
| $\Delta D = D(n) - D(n-1) > D\text{th} \geq 0$ | Condition 1 |
| $\Delta fc = fc(n) - fc(n-1) < fc\text{th} \leq 0$ | Condition 2 |
| $\Delta C = C(n) - C(n-1) > C\text{th} \geq 0$ | Condition 3 |

Here, it is assumed that two or more of Conditions 1 to 3 are satisfied. In this case, the CPU makes a "Yes" determination in Step 845, and then proceeds to Step 850 so as to determine that the element S(i)=S(1) is anomalous and store the result. Next, the CPU proceeds to Step 855 so as to bring the switch SW(i)=SW(1) into the OFF state, and returns to Step 750 of FIG. 7 via Step 895.

Then, in step 750, the CPU determines whether or not the value of the variable i is equal to the value k (that is, whether or not inspection for all the piezoelectric elements has been completed). If the value of the variable i is equal to the value k, the CPU makes a "Yes" determination in Step 750, and proceeds to Step 795 so as to end the inspection. Meanwhile, if the value of the variable i is not equal to the value k, the CPU makes a "No" determination in Step 750, and proceeds to Step 760 so as to increase the value of the variable i by "1". The CPU then returns to Step 730. As a result, the switch SW(i)=SW(2) is brought into the ON state, and thus, the inspection of the next piezoelectric element S(i)=S(2) is executed.

Meanwhile, when it is determined in Step 845 of FIG. 8 that two or more of Conditions 1 to 3 are not satisfied, the CPU makes a "No" determination in Step 845, and proceeds to Step 860 so as to determine that the element S(i)=S(1) is normal and store the result. Next, in step 865, the CPU determines whether or not the value of the variable n is 7. In this case, the value of the variable n is 2. Accordingly, the CPU makes a "No" determination in Step 865, increments the value of the variable n by "1" in Step 870, and returns to Step 810.

Until the value of the variable n becomes 7 and a "Yes" determination is made in Step 865, the processes of Steps 810 to 835, Step 845, Step 860, and Step 870 are repeatedly performed so long as the piezoelectric element is determined anomalous (a "Yes" determination is made in Step 845). When value of the variable n becomes 7, the CPU makes a "Yes" determination in Step 865, and proceeds to the above-described Step 855. As a result, inspection of the next piezoelectric element is started.

As described above, the inspection method according to the first embodiment of the present invention is an inspection method for a piezoelectric element for determining whether or not the piezoelectric element is anomalous, comprising at least:

first-inspection-signal application step (Step 810) of applying to the piezoelectric element a first inspection signal Vp(1)(=Vp(n)) having a first predetermined voltage waveform;

first-characteristic-value measurement step (Steps 820 and 825) of measuring, as a first characteristic value Ch(1)(=Ch(n)), an electrical characteristic value of the piezoelectric element after application of the first inspection signal;

second-inspection-signal application step (Step 810) of applying to the piezoelectric element a second inspection signal Vp(2)(=Vp(n+1)) having a second predetermined voltage waveform and an electrical power greater than that of the first inspection signal;

second-characteristic-value measurement step (Steps 820 and 825) of measuring, as a second characteristic value Ch(2) (=Ch(n+1)), the electrical characteristic value of the piezoelectric element after application of the second inspection signal; and anomaly determination step (Step 845) of determining whether or not the piezoelectric element is anomalous, on the basis of a value corresponding to the difference ΔCh(ΔCh=Ch (n+1)−Ch(n)) between the measured second characteristic value and the measured first characteristic value.

The first and second characteristic values are values peculiar to the piezoelectric element undergoing the inspection. Accordingly, the value corresponding to the difference between the second characteristic value and the first characteristic value is free from the influence of the individual difference. In the present embodiment, determination as to whether or not the piezoelectric element is anomalous is performed on the basis of the value corresponding to the difference (ΔCh; i.e., ΔD, Δfc, ΔC). As a result, determination as to whether or not the piezoelectric element is anomalous can be accurately performed without being affected by a variation of the electrical characteristic value stemming from the individual difference of the piezoelectric element undergoing the inspection.

Further, the first predetermined voltage waveform, which is the waveform of the first inspection signal Vp(1), is a voltage waveform in which a first number N1(=P(n)) of basic waveforms each increasing from 0 to a predetermined voltage value Vpmax and then decreasing from the predetermined voltage value Vpmax to 0, successively appear (or are successively repeated). Similarly, the second inspection voltage waveform, which is the waveform of the second inspection signal Vp(2), is a voltage waveform in which a second number N2(=P(n+1)) of the basic waveforms successively appear (or are successively repeated), the second number N2 being greater than the first number N1.

Accordingly, the high voltage Vpmax is repeatedly applied to the piezoelectric element, so that polarization of the piezoelectric element quickly progresses. Moreover, when each inspection signal is applied, the voltage of each inspection signal frequently increases and decreases, so that repeated stress is generated in the piezoelectric element. In addition, since the second predetermined voltage waveform is composed of the second number N2 of successive basic waveforms, the second inspection signal Vp(2) has an electrical power greater than that of the first inspection signal Vp(1), whereby a larger energy can be applied to the piezoelectric element by the second inspection signal Vp(2). Therefore, when the piezoelectric element is not a normal product, the second inspection signal Vp(2) causes a micro crack to grow further and become overt. As a result, the difference between the first and second characteristic values increases, whereby the determination accuracy in the anomaly determination step can be improved.

In addition, the above-described piezoelectric element inspection method comprises:

a first discharge step (Step 815) of discharging charge from the piezoelectric element after execution of the first-inspection-signal application step and before execution of the first-characteristic-value measurement step; and a second discharge step (Step 815) of discharging charge from the piezoelectric element after execution of the second-inspection-signal application step and before execution of the second-characteristic-value measurement step.

By virtue of these steps, the respective electrical characteristic values are accurately measured regardless of the amount of accumulated charge. As a result, the frequency of occurrence of erroneous determination in the anomaly determination step can be lowered.

(Second Inspection Method)

Next, a piezoelectric element inspection method (second inspection method) according to a second embodiment of the present invention will be described. In this inspection method, the following steps are successively performed.

(1) Step 1: A predetermined first inspection signal (inspection voltage Vp) Vp(1) is applied to a piezoelectric element. The first inspection signal Vp(1) is generated by the power source 12.

The first inspection signal Vp(1) applied to the piezoelectric element in Step 1 has a first predetermined voltage waveform. As shown in a time period of t1 to t2 of FIG. 9, the first predetermined voltage waveform is a voltage waveform whose maximum voltage Vpmax is V1 (in the present example, 100 V). The first inspection signal Vp(1) has a generally rectangular voltage waveform (envelope). In actuality, as shown in FIG. 10, the first inspection signal Vp(1) is a voltage signal which has a waveform composed of a plurality of successive trapezoidal waveforms (basic waveforms), in each of which the voltage increases from 0 V to the maximum voltage Vpmax over a rising time Tu of several microseconds, remains at the maximum voltage Vpmax for a keeping time Tk of several tens of microseconds, and decreases from the maximum voltage Vpmax to 0 V over a falling time Td of several microseconds. The first inspection signal Vp(1) continues over a predetermined time T(1). Notably, the n-th inspection signal Vp(n) used in the steps described below has the same waveform as the first inspection signal Vp(1) in Step 1, except in the point that the maximum voltage Vpmax of the n-th inspection signal Vp(n) differs from that of the first inspection signal Vp(1). That is, the n-th inspection signal Vp(n) is a signal obtained by successively generating voltages each having the basic waveform, in a number equal to that of the first inspection signal Vp(1); and the increasing time Tu, the keeping time Tk, and the decreasing time Td of the basic waveform are identical among the respective inspection signals.

(2) Step 2: Electrical connection is established between the upper and lower electrodes of the piezoelectric element via the discharge resistor 15 for a predetermined discharge time so as to discharge charge accumulated in the piezoelectric element.

(3) Step 3: The electrical characteristic values of the piezoelectric element are measured, and measurement results are stored as Ch(1). In the present example as well, the electrical characteristic values are electric capacitance (electrostatic capacitance) C, loss D, and resonance frequency fc. The electrical characteristic values are measured by the LCR meter 13 and the network analyzer 14 in the same manner as in the first inspection method.

(4) Step 4: At time t3; i.e., upon elapse of a predetermined time Ts after time t2, the second inspection signal Vp(2) (inspection voltage Vp) is applied to the piezoelectric element. As shown in a time period of t3 to t4 of FIG. 9, the second inspection signal Vp(2) applied in this Step 4 is a voltage signal whose maximum voltage value Vpmax is V2 (in this example, 110 V), which is greater than V1. The second predetermined voltage waveform of the second inspection signal Vp(2) is as described above.

As described above, in the present inspection method, every time measurement is completed, an inspection signal Vp(n+1), whose maximum voltage value is greater than that of the previous inspection signal Vp(n) by a predetermined voltage, is applied to the piezoelectric element. That is, when a current inspection signal applied is an inspection signal for the m-th application, the maximum voltage value Vpmax(m) of the current inspection signal Vp(m) is represented by the following Equation (1), where m is a natural number, and Va is predetermined positive value (e.g., 10 V). Accordingly, the electrical power of the (m+1)-th inspection signal Vp(m+1) is greater than that of the m-th inspection signal Vp(m).

$$Vpmax(m)=V1+(m-1)\cdot Va \quad (1)$$

(5) Step 5: Similarly to Step 2, the charge accumulated in the piezoelectric element is discharged.

(6) Step 6: The electrical characteristic values of the piezoelectric element are measured, and measurement results are stored as Ch(2) (i.e., D(2), fc(2), C(2)).

(7) Step 7: Determination as to whether or not the piezoelectric element is anomalous is performed on the basis of the differences $\Delta Ch(=Ch(2)-Ch(1))$ between the electrical characteristic value Ch(2) measured at the present time and the electrical characteristic value Ch(1) measured and stored at the previous time. The determination is performed in the same manner as in Step 7 of the first inspection method, by use of the above-described Conditions 1 to 3.

Here, description will be continued under the assumption that the piezoelectric element undergoing the inspection is normal. In this case, since the piezoelectric element is determined to be normal in Step 7, the following Steps 8 to 11 are further carried out.

(8) Step 8: At time t5; i.e., upon elapse of the predetermined time Ts after time t4, a third inspection signal Vp(3) is applied to the piezoelectric element. As shown in a time period of t5 to t6 of FIG. 9, the third inspection signal Vp(3) applied in this Step 8 is a voltage signal whose maximum voltage value Vpmax is V3 (in this example, 130 V), which is greater than V2.

(9) Step 9: Similarly to Step 2, the charge accumulated in the piezoelectric element is discharged.

(10) Step 10: The electrical characteristic values of the piezoelectric element are measured, and measurement results are stored as Ch(3) (i.e., D(3), fc(3), C(3)).

(11) Step 11: Determination as to whether or not the piezoelectric element is anomalous is performed on the basis of the difference $\Delta Ch(=Ch(3)-Ch(2))$ between the electrical characteristic values Ch(3) measured at the present time and the electrical characteristic values Ch(2) measured and stored at the previous time. This determination is also performed in a manner similar to that in Step 7.

After this time point, similar steps are repeated until the inspection signal is applied a predetermined number of times (in the present example, 7 times in total) and measurement is performed the predetermined number of times or until a determination that "piezoelectric element is anomalous" is made in the mid-course.

That is, the maximum voltage value Vpmax of the n-th inspection signal Vp(n) is increased stepwise from V1 by the predetermined voltage Va each time, the inspection signal Vp(n) is sequentially applied to the piezoelectric element, then the discharge step are performed, and the electrical characteristic values Ch(n) are measured after the discharge step which is performed after application of the inspection signal Vp(n). Subsequently, determination as to whether or not the piezoelectric element is anomalous is performed on the basis of the differences $\Delta Ch(=Ch(n)-Ch(n-1))$ between the electrical characteristic values Ch(n) measured at the present time and the electrical characteristic values Ch(n-1) measured and stored at the previous time. It should be noted that the predetermined voltage Va may be constant throughout the inspection or may be varied every time the inspection voltage Vp(n) is applied.

Figure 11:
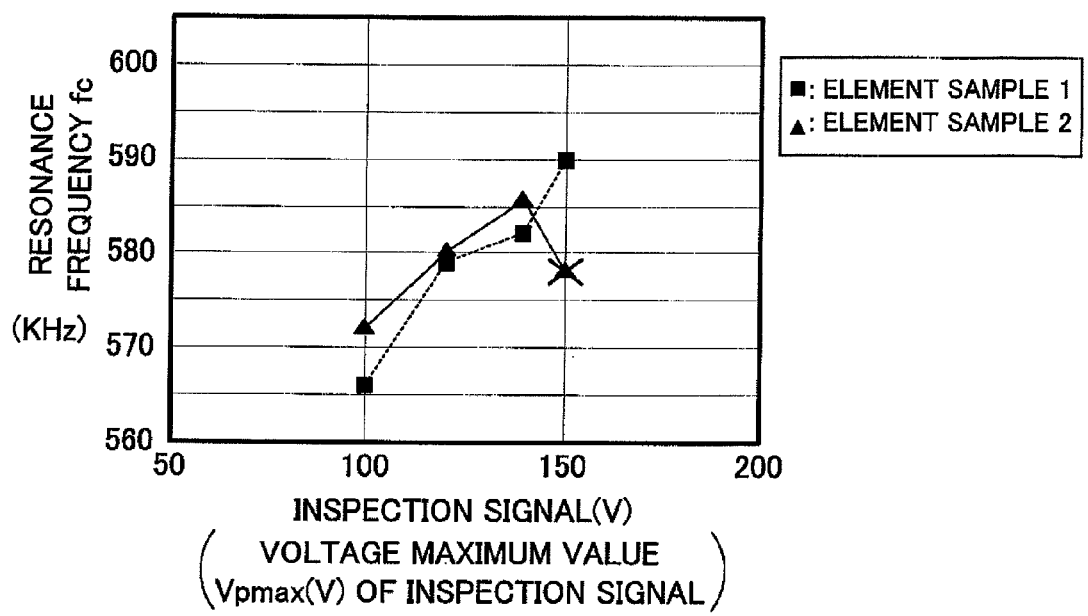
FIG. 11 is a graph showing resonance frequencies of piezoelectric elements measured by the inspection method according to the second embodiment of the present invention.
Figure 12:
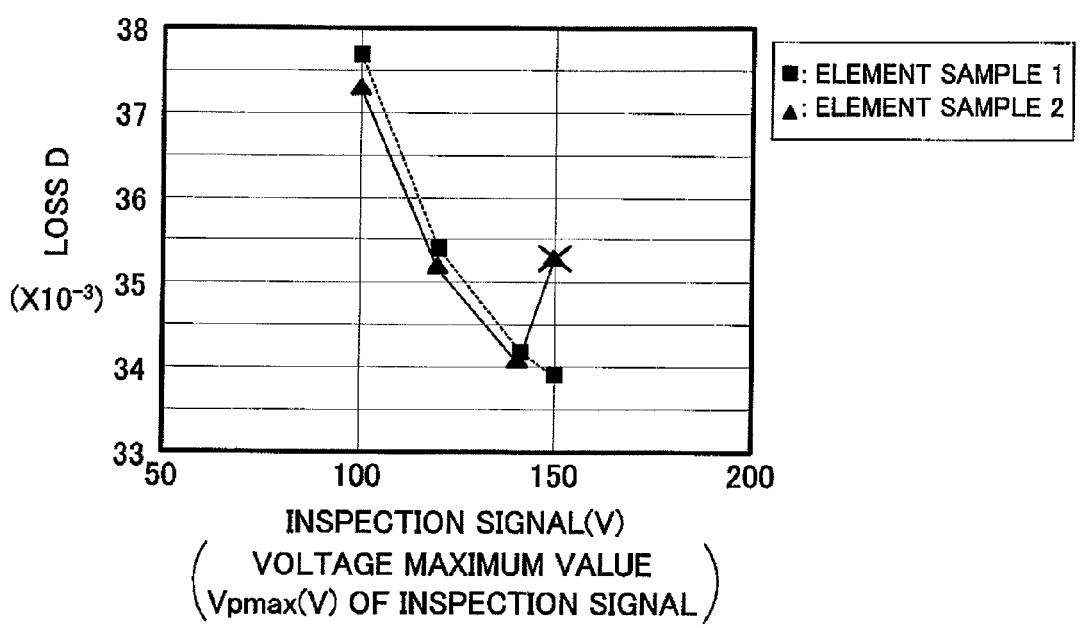
FIG. 12 is a graph showing losses of piezoelectric elements measured by the inspection method according to the second embodiment of the present invention.

FIGS. 11 and 12 shows changes in resonance frequency fc and loss D of two sample piezoelectric elements, the resonance frequency fc and the loss D measured in accordance with the above-described second inspection method. Each sample piezoelectric element contains $(Bi_{0.5}Na_{0.5})TiO_3$ as a main component. Sample 1 is a piezoelectric element to be determined normal. Sample 2 is a piezoelectric element to be determined anomalous. In each of the figures, measurement values of the Sample 1 are indicated by rectangular plots, and measurement values of the Sample 2 are indicated by equilateral-triangular plots. The maximum voltage value Vpmax of the inspection signal Vp(n) was increased from 100 V to 120 V, then to 140 V, and then to 150 V.

In the Sample 1, no micro crack was generated even when the maximum voltage value Vpmax of the inspection signal Vp(n) became 150 V. That is, the resonance frequency fc of the Sample 1 gradually increased and the loss D of the Sample 1 gradually decreased as the maximum voltage value Vpmax of the inspection signal Vp(n) was increased to 150 V. In other words, the difference $\Delta fc(=\Delta Ch=fc(n)-fc(n-1))$ continuously became a positive value until the maximum voltage value Vpmax of the inspection signal Vp(n) reached 150 V, and the difference $\Delta D(=\Delta Ch=D(n)-D(n-1))$ continuously became a negative value until the maximum voltage value Vpmax of the inspection signal Vp(n) reached 150 V.

In contrast, in the Sample 2, a micro crack was generated when the maximum voltage value Vpmax of the inspection signal Vp(n) became 150 V. That is, the resonance frequency fc of the Sample 2 gradually increased until the maximum voltage value Vpmax of the inspection signal Vp(n) reached 140 V. In other words, the above-described difference $\Delta fc$ remained positive until the maximum voltage value Vpmax of the inspection signal Vp(n) reached 140 V. When the maximum voltage value Vpmax of the inspection signal Vp(n) became 150 V, the resonance frequency fc decreased. That is, the difference $\Delta fc$ became negative. Accordingly, the above-described Condition 2 was satisfied.

Further, the loss D of the Sample 2 gradually decreased until the maximum voltage value Vpmax of the inspection signal Vp(n) reached 140 V. In other words, the above-described difference $\Delta D$ remained negative until the maximum voltage value Vpmax of the inspection signal Vp(n) reached 140V. When the maximum voltage value Vpmax of the inspection signal Vp(n) became 150 V, the loss D increased. That is, the difference $\Delta D$ became positive. Accordingly, the above-described Condition 1 was satisfied.

Accordingly, for the Sample 2, two of the above-described Conditions 1 to 3 were satisfied when the maximum voltage value Vpmax of the inspection signal Vp(n) became 150 V. Therefore, the Sample 2 can be determined to be anomalous.

As can be understood from FIGS. 11 and 12, the electrical characteristic values greatly vary among piezoelectric elements due to individual differences among the piezoelectric elements. However, the difference $\Delta Ch$ used for the determination in the above-described inspection method is the difference between the present measurement value Ch(n), which contains characteristics peculiar to each piezoelectric element, and the previous measurement value Ch(n-1), which also contains the characteristics peculiar to the piezoelectric element. Therefore, the difference $\Delta Ch$ is a value in which the characteristics peculiar to each piezoelectric element are cancelled out. Accordingly, determination as to whether or not a piezoelectric element is anomalous can be accurately performed without being influenced by a variation of the electrical characteristic values due to the individual difference of the piezoelectric element.

(Actual Operation of Inspection Apparatus for Carrying Out the Second Inspection Method)

Next, there will be described actual operation of an inspection apparatus which carries out the second inspection method. This apparatus differs from the inspection apparatus of the first embodiment only in that the CPU of the measurement control circuit 11 executes a flowchart (program) of FIG. 13 in place of the flowchart of FIG. 8. Accordingly, in actuality, the present embodiment differs from the first embodiment only in the measurement and determination step in Step 740 of FIG. 7. In the following description, this point of difference will be mainly described.

Here, it is assumed that, in Step 730, the switch SW(i) has been brought into the ON state, and the piezoelectric element S(i) has been selected as a piezoelectric element to be measured.

Figure 13:
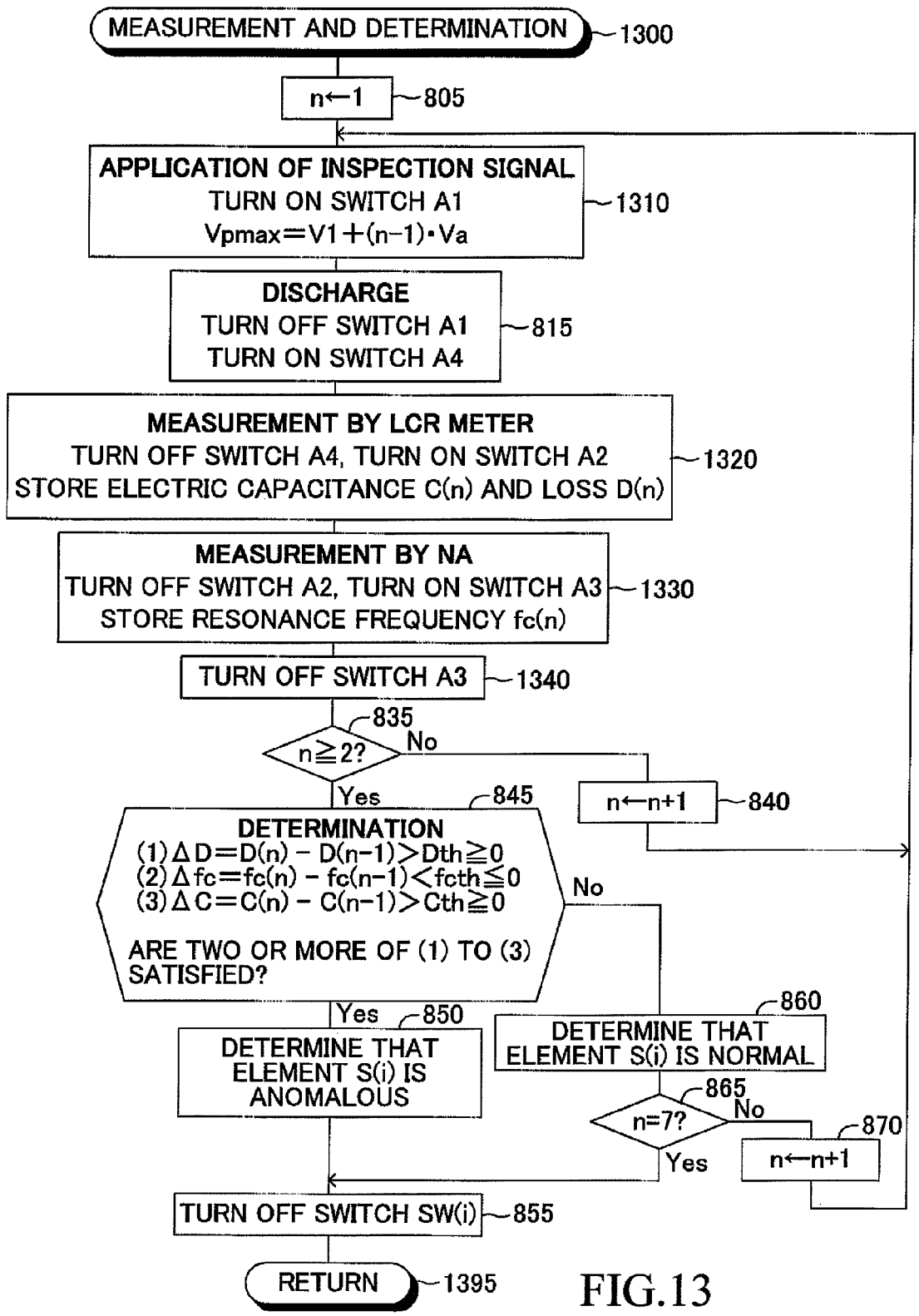
FIG. 13 is a flowchart showing a program executed by a CPU of a measurement control apparatus according to the second embodiment of the present invention.

Under this assumption, the CPU proceeds to Step 740, and then proceeds to Step 805 of FIG. 13 via Step 1300 thereof. In Step 805, the CPU sets the value of a variable n to "1." The CPU then performs the following processing.

Step 1310: The CPU maintains the switch A1 in the ON state over a predetermined time T(1). In this case, the switch SW(i) is in the ON state. The inspection signal Vp(n) generated by the power source 12 is applied to the piezoelectric element S(i). At this time, the CPU supplies an instruction to the power source 12 such that the maximum voltage value Vpmax becomes a value (Vpmax=V1+(n−1)·Va) obtained by adding "the product of a variable (n−1) and a voltage increase Va" to the initial voltage V1. Here, the initial voltage V1 is 100 V, and the voltage increase Va is 10 V. Since the value of the variable n at this stage is "1," the maximum voltage value Vpmax becomes 100 V. As a result, the power source 12 generates an inspection signal Vp(1) shown in the period of t1 to t2 of FIGS. 9 and 10, and this signal is applied to the piezoelectric element S(i).

Step 815: The CPU brings the switch A1 into the OFF state, and maintains the switch A4 in the ON state over a predetermined discharge time, which is shorter than the measurement time Ts. Thus, the upper and lower electrode of the piezoelectric element S(i)=S(1) are connected via the discharge resistor 15. As a result, the charge accumulated in the piezoelectric element S(i) is discharged.

Step 1320: The CPU brings the switch A4 into the OFF state, and brings the switch A2 into the ON state. As a result, the LCR meter 13 is connected to the piezoelectric element S(i). Simultaneously, the CPU causes the LCR meter 13 to measure the electric capacitance C and loss D of the piezoelectric element S(i), and stores the measured electric capacitance C and loss D as C(n)=C(1) and D(n)=D(1), respectively.

Step 1330: The CPU brings the switch A2 into the OFF state, and brings the switch A3 into the ON state. As a result, the network analyzer 14 is connected to the piezoelectric element S(i). Simultaneously, the CPU causes the network analyzer 14 to measure the resonance frequency fc of the piezoelectric element S(i), and stores the measured resonance frequency fc as fc(n)=fc(1).

Step 1340: The CPU brings the switch A3 into the OFF state.

Step 835: The CPU determines whether or not the value of the variable n is equal to or greater than 2. In this case, the value of the variable n is "1." Therefore, the CPU makes a "No" determination in Step 835, and proceeds to Step 840 so as to increase the value of the variable n by "1." Subsequently, the CPU returns to Step 1310.

After that, the CPU then performs the processes of Steps 1310, 815, 1320, 1330, and 1340. As a result, the second inspection signal Vp(2) whose maximum voltage value Vpmax is 110V (=V1+1·Va=100+10) is applied to the piezoelectric element S(i), and the electric capacitance C, the loss D, and the resonance frequency fc after discharge are stored as C(2), D(2), and fc(2), respectively.

At this stage, the value of the variable n is 2. Accordingly, the CPU makes a "Yes" determination when it proceeds to Step 835, and then proceeds to Step 845 so as to determine whether or not two or more of the above-described Conditions 1 to 3 are satisfied.

Here, it is assumed that two or more of Conditions 1 to 3 are satisfied. In this case, the CPU makes a "Yes" determination in Step 845, and then proceeds to Step 850 so as to determine that the element S(i) is anomalous and store the result. Next, the CPU proceeds to Step 855 so as to bring the switch SW(i) into the OFF state, and returns to Step 750 of FIG. 7 via Step 1395.

Meanwhile, when it is determined in Step 845 of FIG. 13 that two or more of Conditions 1 to 3 are not satisfied, the CPU makes a "No" determination in Step 845, and proceeds to Step 860 so as to determine that the element S(i) is normal and store the result. Next, in step 865, the CPU determines whether or not the value of the variable n is 7. In this case, the value of the variable n is 2. Accordingly, the CPU makes a "No" determination in Step 865, increments the value of the variable n by "1" in Step 870, and returns to Step 1310.

Until the value of the variable n becomes 7 and a "Yes" determination is made in Step 865, the above-described processing is repeatedly performed so long as the piezoelectric element S(i) is determined to be anomalous (a "Yes" determination is made in Step 845). When the value of the variable n becomes 7, the CPU makes a "Yes" determination in Step 865, proceeds to Step 855, and then returns to Step 750 of FIG. 7. As a result, inspection of the next piezoelectric element S(i+1) is started.

As described above, the inspection method of the present invention comprises:

first-inspection-voltage application step (Step 1310) of applying to the piezoelectric element a first inspection voltage (first inspection signal) which has a predetermined voltage waveform and whose maximum voltage value is a predetermined first voltage value;

first-characteristic-value measurement step (Steps 1320 and 1330) of measuring, as a first characteristic value, an electrical characteristic value of the piezoelectric element after application of the first inspection voltage;

second-inspection-voltage application step (Step 1310) of applying to the piezoelectric element a second inspection voltage (second inspection signal) which has a predetermined voltage waveform and whose maximum voltage value is a predetermined second voltage value greater than the first voltage value;

second-characteristic-value measurement step (Steps 1320 and 1330) of measuring, as a second characteristic value, the electrical characteristic value of the piezoelectric element after application of the second inspection voltage; and anomaly determination step (Step 845) of determining whether or not the piezoelectric element is anomalous, on the basis of a value corresponding to the difference between the measured second characteristic value and the measured first characteristic value.

Accordingly, determination as to whether or not the piezoelectric element is anomalous is performed on the basis of a value corresponding to the difference between the "first characteristic value which is the electrical characteristic value of the piezoelectric element after application of the first inspection voltage" and the "second characteristic value which is the electrical characteristic value of the piezoelectric element after application of the second inspection voltage." Therefore, determination as to whether or not the piezoelectric element is anomalous can be accurately performed without being affected by a variation of the electrical characteristic value due to the individual difference of the piezoelectric element undergoing the inspection.

Further, the above-described piezoelectric element inspection method comprise:

a first discharge step (Step 815) of discharging charge from the piezoelectric element after execution of the first-inspection-voltage application step and before execution of the first-characteristic-value measurement step; and a second discharge step (Step 815) of discharging charge from the piezoelectric element after execution of the second-inspection-voltage application step and before execution of the second-characteristic-value measurement step.

By virtue of these steps, the amount of charge accumulated in the piezoelectric element after application of each inspection voltage does not affect the electrical characteristic value, and therefore, the electrical characteristic value is accurately measured. As a result, the frequency of occurrence of erroneous determination in the anomaly determination step can be lowered.

In addition, the waveform of each inspection voltage (inspection signal) is a waveform in which a certain waveform (trapezoidal basic waveform), which increases from 0 to a predetermined voltage value (Vpmax) and then decreases from the predetermined voltage value Vpmax to 0, repeatedly appears over a predetermined time. Therefore, when each inspection signal is applied, the voltage of each inspection signal frequently increases and decreases, so that repeated stress is generated in the piezoelectric element. Thus, if a micro crack is present in the piezoelectric element, through application of such inspection voltage, the micro crack is caused to grow and become overt (the electrical characteristic values are caused to change greatly). As a result, more accurate determination can be performed.

(Polarization Method for Piezoelectric Element)

Next, there will be described an embodiment of a method of polarizing a piezoelectric element (ferroelectric body) according to the present invention.

As described above, polarization of a piezoelectric element can be quickly performed through repeated application to the piezoelectric element a pulse-shaped voltage signal (voltage pulse) which increases from zero to a predetermined voltage value, and then decreases from the predetermined voltage value to zero.

In view of the above, in the present embodiment, polarization of a piezoelectric element is performed by making use of the inspection signals used in the first and second embodiments.

That is, as shown in FIGS. 4 and 5 or FIGS. 9 and 10, the polarization method of the present invention includes a step of applying a pulse-shaped voltage to a piezoelectric element a plurality of times to thereby progressively polarize the piezoelectric element. When only the polarization of a piezoelectric element is performed; i.e., when inspection of the piezoelectric element is not necessary, the above-described step of obtaining electrical characteristic values and the above-described step of performing anomaly determination may be omitted. Accordingly, in this case, the above-described "inspection signal" can be simply called "application signal" or "application signal for polarization."

Further, in this case, the step of progressing polarization of a piezoelectric element is preferably a step of gradually increasing the magnitude of the pulse-shaped voltage with the number of times of application of the pulse-shaped voltage, as shown in FIGS. 9 and 10, FIG. 14, and FIG. 15.

Figure 9:
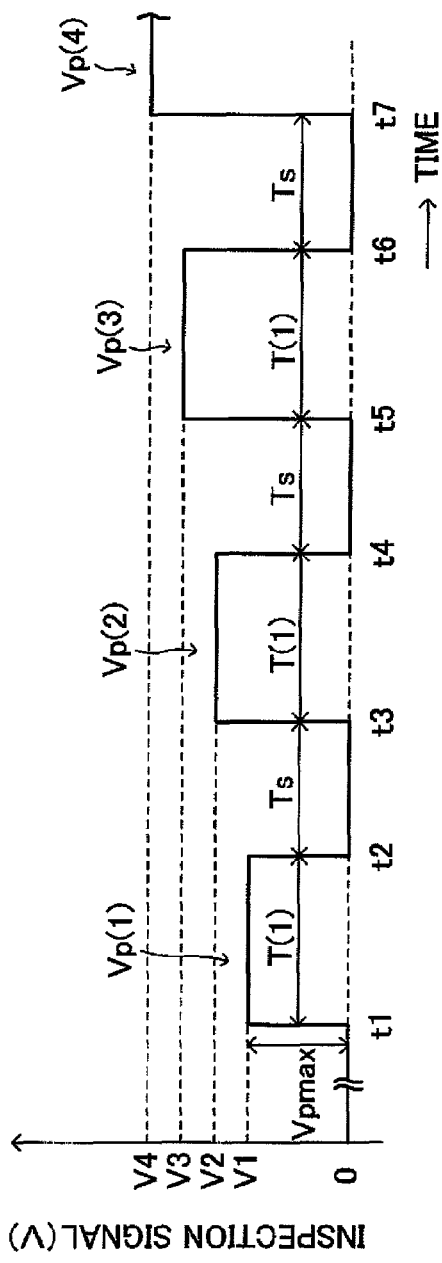
FIG. 9 is a time chart showing an inspection signal applied to a piezoelectric element in an inspection method according to a second embodiment of the present invention.
Figure 10:
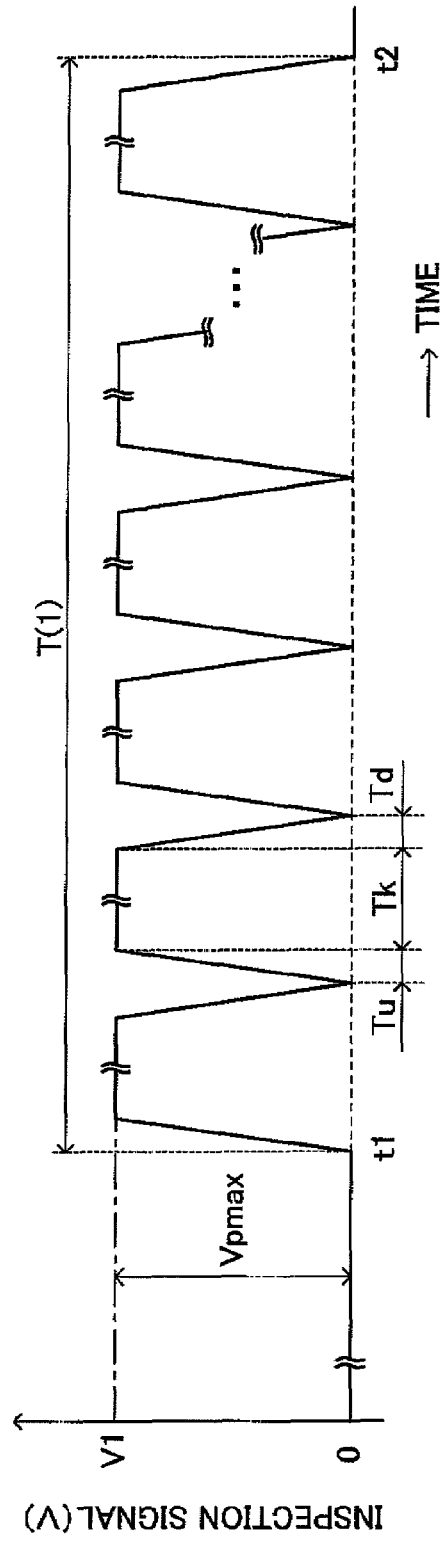
FIG. 10 is an enlarged view of the inspection signal shown in FIG. 9.
Figure 14:
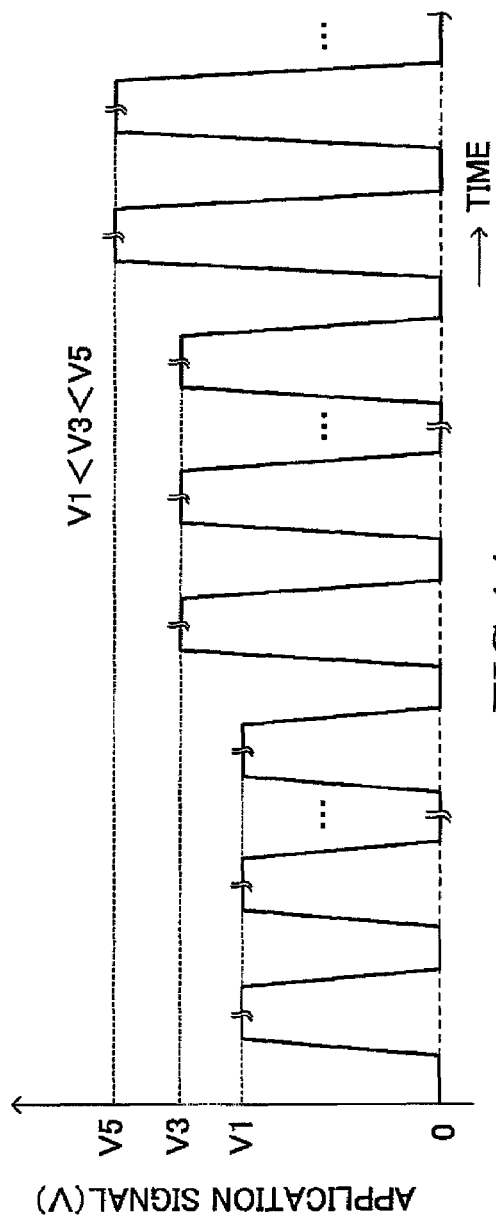
FIG. 14 is a time chart showing an example application signal used in an embodiment of a polarization method according to the present invention.
Figure 15:
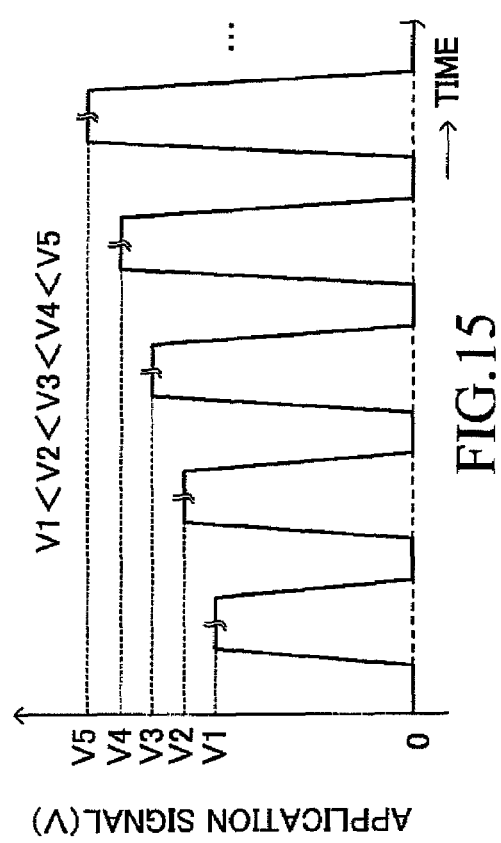
FIG. 15 is a time chart showing another example application signal used in the embodiment of the polarization method according to the present invention.

Notably, in FIGS. 9 and 14 and FIG. 15, after a pulse (pulse-shaped voltage) whose maximum voltage value Vpmax (voltage of the pulse) is a voltage Vn (n: natural number) is applied a plurality of times, a pulse having a voltage Vn+1 greater than the voltage Vn is applied a plurality of times. This is (these pulses are) also included in the "gradually increasing the magnitude of the pulse-shaped voltage with the number of times of application of the pulse-shaped voltage."

Such polarization method enables a piezoelectric element to be polarized within a short time. Further, micro cracks generated when polarization is performed through continuous application of DC voltage can be reduced. Presumably, this reduction of micro cracks is attained because of the following reason. In the present embodiment, since the applied voltage has a pulse shape, electric dipoles are oriented in a common direction, while stress present within the piezoelectric element is relaxed.

In particular, the polarization method according to the present embodiment is preferably used for the piezoelectric element 34 of the device 30 shown in FIG. 3.

In this case, after the piezoelectric element 34 is manufactured in the form of the device 30 (or at least after the piezoelectric element 34 is fixed to the upper surface of the separate vibration plate 33 by means of adhesive), the pulse-shaped voltage according to the above-described polarization method is applied to the piezoelectric element 34 of the device 30 a plurality of times, whereby polarization of the piezoelectric element 34 is carried out.

In a case where a piezoelectric element to be polarized is fixed to a separate vibration plate as described above, a stress acts on the piezoelectric element because the piezoelectric element is fixed to the vibration plate. Accordingly, if a piezoelectric element in such a state (state in which stress acts thereon) is polarized by applying the above-described pulse-shaped voltage to the piezoelectric element a plurality of time, it becomes possible to carry out polarization of the piezoelectric element while avoiding application of excessive stress to the piezoelectric element or avoiding application of excessive stress to the adhesive used to fix the piezoelectric element to the vibration plate.

Accordingly, it is possible to reduce the generation rate of micro cracks which are generated in the piezoelectric element itself due to polarization, or to reduce the possibility of lowering of the bonding strength between the piezoelectric element and the vibration plate due to polarization. As a result, the reliabilities of the piezoelectric element and the device (piezoelectric element actuator) including the piezoelectric element can be improved.

Similarly, the polarization method according to the present embodiment is preferably used for the piezoelectric element 24 of the device 20 shown in FIG. 2.

In this case, after the piezoelectric element 24 is manufactured in the form of the device 20 (or at least after the piezoelectric element 24 is fired integrally with the vibration plate 23), the pulse-shaped voltage according to the above-described polarization method is applied to the piezoelectric element 24 of the device 20 a plurality of times, whereby polarization of the piezoelectric element 24 is carried out.

As described above, even in a case where a piezoelectric element to be polarized is fired integrally with a vibration plate, stresses remain not only in the piezoelectric element and the vibration plate but also in upper and lower electrodes fired integrally with the piezoelectric element. Accordingly, if polarization of a piezoelectric element in such a state (state in which stress acts thereon) is performed through application of the above-described pulse-shaped voltage a plurality of time, the reliabilities of the piezoelectric element and the device (piezoelectric element actuator) including the piezoelectric element can be improved, for the same reason as in the above-described case. Further, since it is possible to carry out polarization of the piezoelectric element while avoiding application of excessive stress to the piezoelectric element, the number of times of application of a pulse (pulse shaped voltage) can be increased and/or the voltage of the pulse can be increased. As a result, the polarizability of the piezoelectric element can be further improved, and the performance of the piezoelectric element can be improved.

In the above, the piezoelectric element inspection method and apparatus and the piezoelectric element polarization method according to the present invention have been described. The present invention is not limited to the above-described embodiments, and various modifications can be employed within the scope of the present invention. For example, the basic waveform of each inspection signal or the application signal for polarization may be other waveforms such as a simple rectangular waveform, a triangular waveform, and a sinusoidal waveform, insofar as a selected waveform can deform the piezoelectric element.

Moreover, in the second embodiment, determination as to whether or not a piezoelectric element is anomalous is performed on the basis of the difference $\Delta Ch (\Delta Ch = Ch(n) - Ch(n-1)$; e.g., $\Delta D$, $\Delta fc$, $\Delta C$) between the second characteristic value $Ch(n)$ and the first electrical characteristic value $Ch(n-1)$. However, determination as to whether or not a piezoelectric element is anomalous may be performed on the basis of a value $Rt(Rt=\Delta Ch/Va)$, which is obtained by dividing the "difference $\Delta Ch$ between the second characteristic value $Ch(n)$ and the first electrical characteristic value $Ch(n-1)$" by the "difference Va between the second voltage value $V(n)$ and the first voltage value $V(n-1)$." In this case, it becomes possible to accurately perform the determination irrespective not only of the individual difference of the piezoelectric element but also of the magnitude of the difference Va of the maximum voltage values of the applied inspection voltages. Moreover, as a value corresponding to the difference $\Delta Ch$ between the second characteristic value $Ch(n)$ and the first electrical characteristic value $Ch(n-1)$, their ratio $(Ch(n)/Ch(n-1))$ may be used for determination as to whether or not a piezoelectric element is anomalous.

In addition, in the above-described embodiments, the inspection signals are applied 7 times in total; the electrical characteristic values are measured each time the inspection signal is supplied; and the determination step is performed 6 times in total. However, determination as to whether or not a piezoelectric element is anomalous may be performed by performing application of the inspection signal and measurement of the electrical characteristic values two times in total, and performing the determination step once. In this case, an inspection voltage (first inspection signal) $Vp(1)$ firstly applied to a piezoelectric element of a certain type to be inspected and an inspection voltage (second inspection signal) $Vp(2)$ subsequently (secondly) applied to the piezoelectric element are desirably set such that no micro crack is generated in the piezoelectric element of the certain type by the first inspection signal $Vp(1)$ (or the maximum voltage value Vpmax of the first inspection signal $Vp(1)$), but a micro crack is generated in the piezoelectric element of the certain type by the second inspection signal $Vp(2)$ (or the maximum voltage value Vpmax of the second inspection signal $Vp(2)$) if the piezoelectric element is anomalous (defective).

In addition, in the above-described embodiments, three types of electrical characteristic values; i.e., loss D, resonance frequency fc and electric capacitance C, are measured, and determination as to whether or not a piezoelectric element is anomalous is performed by use of these values. However, only one of these electrical characteristic values may be measured to be used for determination of anomaly of the piezoelectric element. Further, preferably, two types of electrical characteristic values; i.e., loss D and resonance frequency fc, may be measured to be used for determination of anomaly of the piezoelectric element. Moreover, in this case, it is desirable to determine that "the piezoelectric element is anomalous" when both the above-described Conditions 1 and 2 are satisfied, in order to avoid erroneous determination. Needless to say, the determination that "the piezoelectric element is anomalous" may be made when any one of the above-described Conditions 1 and 2 is satisfied. Further, the impedance, admittance, phase, electrode resistance, reactance, conductance, susceptance, inductance, etc, of a piezoelectric element (piezoelectric body) may be used as the electrical characteristic values.

Notably, in the above-described embodiments, an inspection signal for the first application is referred to as the first inspection signal, and an inspection signal for the second application is referred to as the second inspection signal. However, the first one of two inspection signals successively generated with a predetermined time Ts interposed therebetween may be referred to as the first inspection signal, and the second one as the second inspection signal. Further, an electrical characteristic value measured immediately after the first inspection signal can be referred to as the first characteristic value, and an electrical characteristic value measured immediately after the second inspection signal can be referred to as the second characteristic value.

Figure 4:
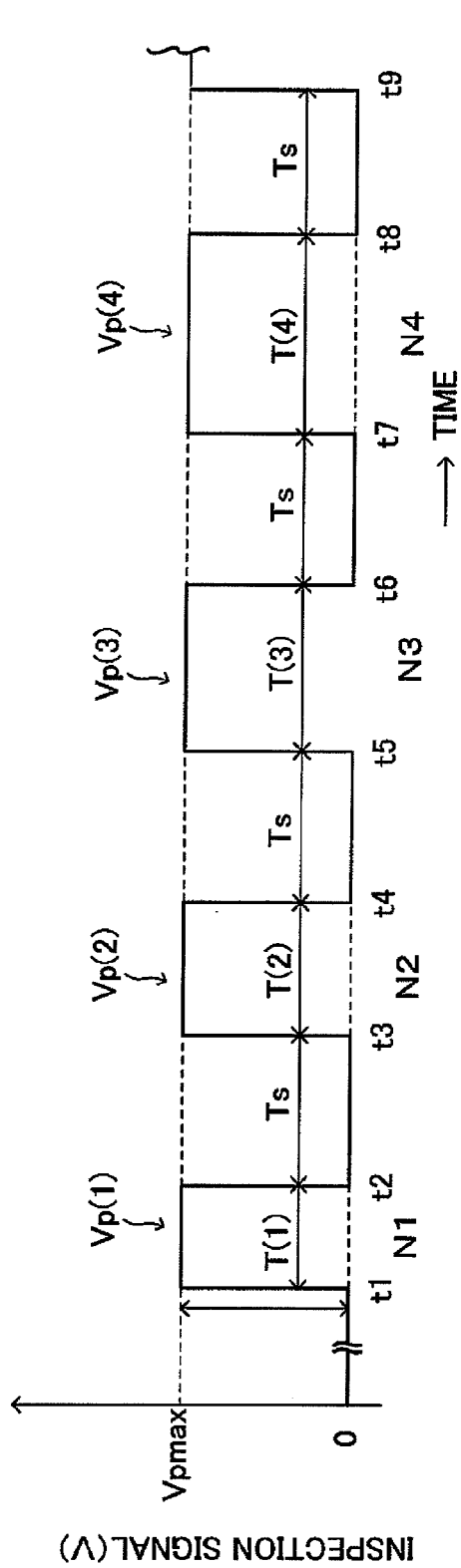
FIG. 4 is a time chart showing an inspection signal applied to a piezoelectric element in the inspection method according to the first embodiment of the present invention.
Figure 16:
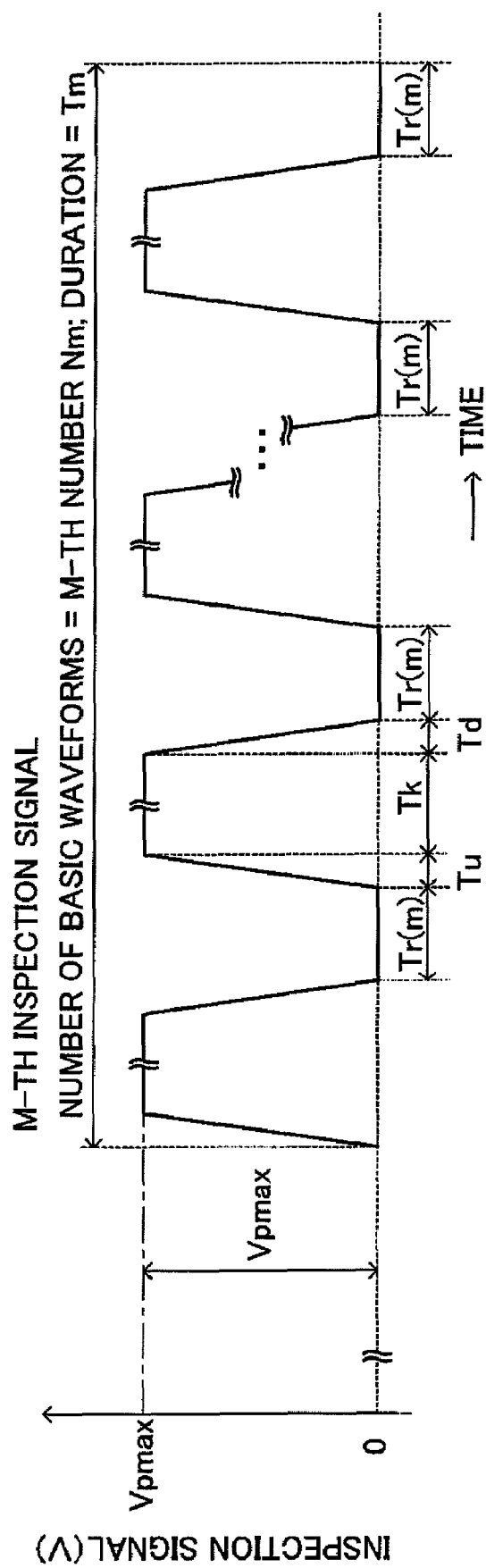
FIG. 16 is a time chart showing a modification of the inspection signal used in the first embodiment.

Moreover, in each inspection signal in the first embodiment, a period in which the voltage value is 0 V is not provided between basic waveforms (pulses), as shown in FIGS. 4 and 5. However, as shown in FIG. 16, a period in which the voltage value is maintained at 0 V over a predetermined time Tr may be provided between successive basic waveforms.

That is, the m-th inspection signal having the m-th predetermined voltage waveform (m is a natural number) in the first embodiment may be a signal in which a period in which the voltage value is maintained at 0 V over the m-th predetermined time Tr(m) is provided between a certain basic waveform and the next basic waveform. In other words, the basic waveform contained in the m-th predetermined voltage waveform is a "voltage waveform in which the voltage increases from 0 to a predetermined voltage value, remains at the predetermined voltage value for the keeping time Tk, decreases from the predetermined voltage value to 0, and then remains at 0 over the m-th predetermined stop time Tr(m)." The m-th predetermined voltage waveform may be a waveform which contains an m-th number Nm of such basic waveforms.

Figure 17:
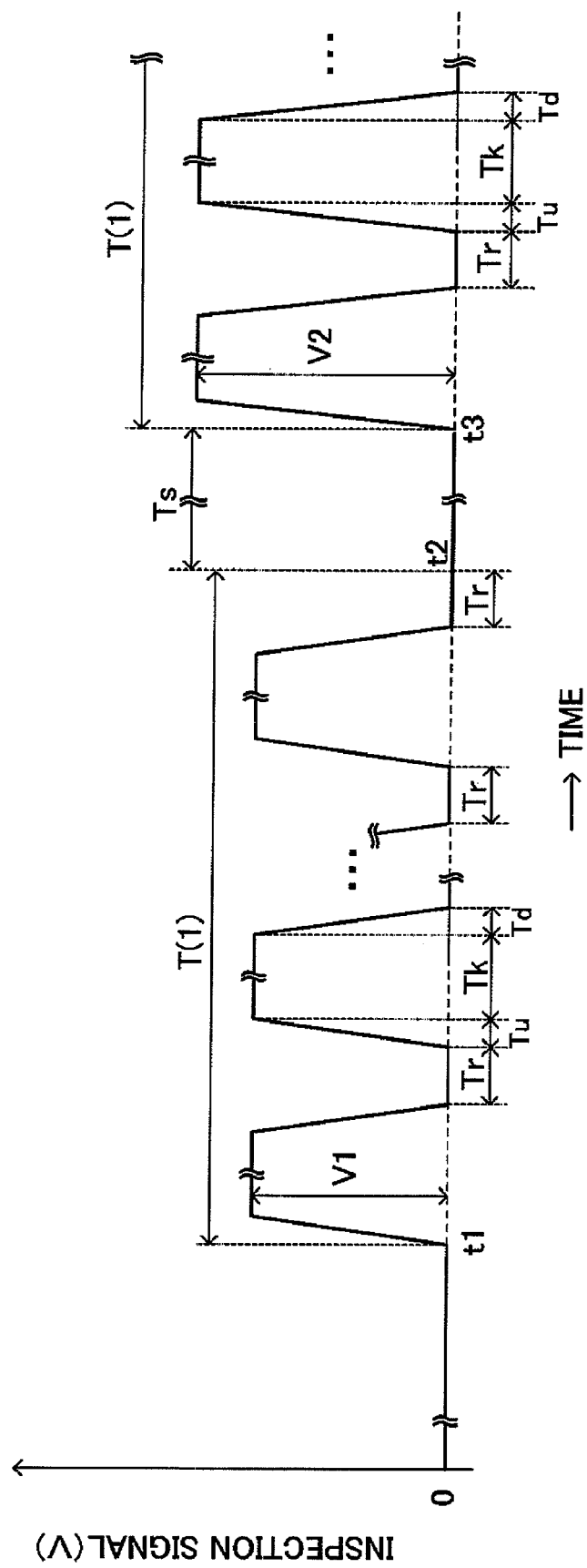
FIG. 17 is a time chart showing a modification of the inspection signal used in the second embodiment.

Similarly, in each inspection signal in the second embodiment, a period in which the voltage value is 0 V is not provided between basic waveforms (pulses), as shown in FIGS. 9 and 10. However, as shown in FIG. 17, a period in which the voltage value is maintained at 0 V over a predetermined time Tr may be provided between successive basic waveforms.

That is, it can be said that the m-th inspection signal having the m-th predetermined voltage waveform (m is a natural number) in the second embodiment is a signal having a voltage waveform in which a basic waveform is repeated over the m-th application period T(m), the basic waveform being a "voltage waveform in which the voltage increases from 0 to a predetermined voltage value Vm, remains at the predetermined voltage value Vm for the keeping time Tk, decreases from the predetermined voltage value Vm to 0, and then remains at 0 over the m-th predetermined stop time Tr(m)."

The invention claimed is:

1. An inspection method for a piezoelectric element for determining whether or not the piezoelectric element is anomalous, the method comprising at least:
   first-inspection-signal application step of applying to the piezoelectric element a first inspection signal having a first predetermined voltage waveform, the first predetermined voltage waveform is a voltage waveform composed of a first number of successive basic waveforms each increasing from zero to a predetermined voltage value and then decreasing from the predetermined voltage value to zero;
   first-characteristic-value measurement step of measuring, as a first characteristic value, an electrical characteristic value of the piezoelectric element after application of the first inspection signal;
   second-inspection-signal application step of applying to the piezoelectric element a second inspection signal having a second predetermined voltage waveform and an electrical power greater than that of the first inspection signal, the second predetermined voltage waveform is a voltage waveform composed of a second number of the successive basic waveforms or successive second waveforms each including the basic waveform, the second number being larger than the first number;
   second-characteristic-value measurement step of measuring, as a second characteristic value, the electrical characteristic value of the piezoelectric element after application of the second inspection signal; and
   anomaly determination step of determining whether or not the piezoelectric element is anomalous on the basis of a value corresponding to the difference between the measured second characteristic value and the measured first characteristic value,
   wherein the basic waveform is a voltage waveform in which at least one of an increasing time, which is a time required to increase from zero to the predetermined voltage value, and a decreasing time, which is a time required to decrease from the predetermined voltage value to zero, substantially coincides with the resonance period of the piezoelectric element.

2. An inspection method according to claim 1, wherein the increasing time and the decreasing time have the same length and substantially coincide with the resonance period.

3. An inspection method according to claim 1, wherein the first predetermined voltage waveform is a voltage waveform whose maximum voltage value is a predetermined first voltage value; and
   the second predetermined voltage waveform is a voltage waveform whose maximum voltage value is a predetermined second voltage value greater than the first voltage value.

4. An inspection method according to claim 3, wherein
   the first predetermined voltage waveform is a voltage waveform composed of a plurality of successive first basic waveforms each increasing from zero to the first voltage value and then decreasing from the first voltage value to zero; and
   the second predetermined voltage waveform is a voltage waveform composed of a plurality of successive second basic waveforms each increasing from zero to the second voltage value and then decreasing from the second voltage value to zero.

5. An inspection method according to claim 4, wherein the value corresponding to the difference between the second characteristic value and the first characteristic value in the anomaly determination step is the difference between the second characteristic value and the first characteristic value or a value obtained by dividing the difference between the second characteristic value and the first characteristic value by the difference between the second voltage value and the first voltage value.

6. An inspection method according to claim 1, further comprising:
   a first discharge step of discharging charge from the piezoelectric element after execution of the first-inspectionsignal application step and before execution of the first-characteristic-value measurement step; and a second discharge step of discharging charge from the piezoelectric element after execution of the second-inspection-signal application step and before execution of the second-characteristic-value measurement step.

7. An inspection method according to claim 1, wherein the piezoelectric element is a piezoelectric element fixed to a vibration plate which is a member separate from the piezoelectric element.

8. An inspection method according to claim 1, wherein the piezoelectric element is a piezoelectric element which is integrated with a vibration plate of zirconia through firing.

9. An inspection method for a piezoelectric element for determining whether or not the piezoelectric element is anomalous, the method comprising at least:

first-inspection-signal application step of applying to the piezoelectric element a first inspection signal having a first predetermined voltage waveform, wherein the first predetermined voltage waveform is a voltage waveform whose maximum voltage value is a predetermined first voltage value, and is a voltage waveform composed of a plurality of successive first basic waveforms each increasing from zero to the first voltage value and then decreasing from the first voltage value to zero;

first-characteristic-value measurement step of measuring, as a first characteristic value, an electrical characteristic value of the piezoelectric element after application of the first inspection signal;

second-inspection-signal application step of applying to the piezoelectric element a second inspection signal having a second predetermined voltage waveform and an electrical power greater than that of the first inspection signal, wherein the second predetermined voltage waveform is a voltage waveform whose maximum voltage value is a predetermined second voltage value greater than the first voltage value, and is a voltage waveform composed of a plurality of successive second basic waveforms each increasing from zero to the second voltage value and then decreasing from the second voltage value to zero;

second-characteristic-value measurement step of measuring, as a second characteristic value, the electrical characteristic value of the piezoelectric element after application of the second inspection signal; and anomaly determination step of determining whether or not the piezoelectric element is anomalous on the basis of a value corresponding to the difference between the measured second characteristic value and the measured first characteristic value, wherein the first basic waveform is a voltage waveform in which at least one of an increasing time, which is a time required to increase from zero to the first voltage value, and a decreasing time, which is a time required to decrease from the first voltage value to zero, substantially coincides with the resonance period of the piezoelectric element.

10. An inspection method according to claim 9, wherein the increasing time and the decreasing time have the same length and substantially coincide with the resonance period.

11. An inspection method for a piezoelectric element for determining whether or not the piezoelectric element is anomalous, the method comprising at least:

first-inspection-signal application step of applying to the piezoelectric element a first inspection signal having a first predetermined voltage waveform, wherein the first predetermined voltage waveform is a voltage waveform whose maximum voltage value is a predetermined first voltage value, and is a voltage waveform composed of a plurality of successive first basic waveforms each increasing from zero to the first voltage value and then decreasing from the first voltage value to zero;

first-characteristic-value measurement step of measuring, as a first characteristic value, an electrical characteristic value of the piezoelectric element after application of the first inspection signal:

second-inspection-signal application step of applying to the piezoelectric element a second inspection signal having a second predetermined voltage waveform and an electrical power greater than that of the first inspection signal, wherein the second predetermined voltage waveform is a voltage waveform whose maximum voltage value is a predetermined second voltage value greater than the first voltage value, and is a voltage waveform composed of a plurality of successive second basic waveforms each increasing from zero to the second voltage value and then decreasing from the second voltage value to zero:

second-characteristic-value measurement step of measuring, as a second characteristic value, the electrical characteristic value of the piezoelectric element after application of the second inspection signal: and anomaly determination step of determining whether or not the piezoelectric element is anomalous on the basis of a value corresponding to the difference between the measured second characteristic value and the measured first characteristic value, wherein the second basic waveform is a voltage waveform in which at least one of an increasing time, which is a time required to increase from zero to the second voltage value, and a decreasing time, which is a time required to decrease from the second voltage value to zero, substantially coincides with the resonance period of the piezoelectric element.

12. An inspection method according to claim 11, wherein the increasing time and the decreasing time have the same length and substantially coincide with the resonance period.

13. An inspection method for a piezoelectric element for determining whether or not the piezoelectric element is anomalous, the method comprising at least:

first-inspection-signal application step of applying to the piezoelectric element a first inspection signal having a first predetermined voltage waveform, the first predetermined voltage waveform is a voltage waveform composed of a first number of successive basic waveforms each increasing from zero to a predetermined voltage value and then decreasing from the predetermined voltage value to zero;

first-characteristic-value measurement step of measuring, as a first characteristic value, an electrical characteristic value of the piezoelectric element after application of the first inspection signal;

second-inspection-signal application step of applying to the piezoelectric element a second inspection signal having a second predetermined voltage waveform and an electrical power greater than that of the first inspection signal, the second predetermined voltage waveform is a voltage waveform composed of a second number of the successive basic waveforms or successive second waveforms each including the basic waveform, the second number being larger than the first number;

second-characteristic-value measurement step of measuring, as a second characteristic value, the electrical characteristic value of the piezoelectric element after application of the second inspection signal; and anomaly determination step of determining whether or not the piezoelectric element is anomalous on the basis of a value corresponding to the difference between the measured second characteristic value and the measured first characteristic value, wherein the electrical characteristic value measured in the first-characteristic-value measurement step and the second-characteristic-value measurement step is at least one of the electric capacitance, loss, and resonance frequency of the piezoelectric element.

14. An inspection method for a piezoelectric element for determining whether or not the piezoelectric element is anomalous, the method comprising at least:

first-inspection-signal application step of applying to the piezoelectric element a first inspection signal having a first predetermined voltage waveform, the first predetermined voltage waveform is a voltage waveform composed of a first number of successive basic waveforms each increasing from zero to a predetermined voltage value and then decreasing from the predetermined voltage value to zero;

first-characteristic-value measurement step of measuring, as a first characteristic value, an electrical characteristic value of the piezoelectric element after application of the first inspection signal;

second-inspection-signal application step of applying to the piezoelectric element a second inspection signal having a second predetermined voltage waveform and an electrical power greater than that of the first inspection signal, the second predetermined voltage waveform is a voltage waveform composed of a second number of the successive basic waveforms or successive second waveforms each including the basic waveform, the second number being larger than the first number;

second-characteristic-value measurement step of measuring, as a second characteristic value, the electrical characteristic value of the piezoelectric element after application of the second inspection signal; and anomaly determination step of determining whether or not the piezoelectric element is anomalous on the basis of a value corresponding to the difference between the measured second characteristic value and the measured first characteristic value, wherein the electrical characteristic value measured in the first-characteristic-value measurement step and the second-characteristic-value measurement step includes the loss and resonance frequency of the piezoelectric element; and the anomaly determination step includes obtaining a first determination result, which is a result of determination as to whether or not the piezoelectric element is anomalous performed on the basis of a value corresponding to the difference between a loss measured as the second characteristic value and a loss measured as the first characteristic value, obtaining a second determination result, which is a result of determination as to whether or not the piezoelectric element is anomalous performed on the basis of a value corresponding to the difference between a resonance frequency measured as the second characteristic value and a resonance frequency measured as the first characteristic value, and determining whether or not the piezoelectric element is anomalous on the basis of the first and second determination results.

15. An inspection method for a piezoelectric element for determining whether or not the piezoelectric element is anomalous, the method comprising at least:

first-inspection-signal application step of applying to the piezoelectric element a first inspection signal having a first predetermined voltage waveform;

first-characteristic-value measurement step of measuring, as a first characteristic value, an electrical characteristic value of the piezoelectric element after application of the first inspection signal;

second-inspection-signal application step of applying to the piezoelectric element a second inspection signal having a second predetermined voltage waveform and an electrical power greater than that of the first inspection signal;

second-characteristic-value measurement step of measuring, as a second characteristic value, the electrical characteristic value of the piezoelectric element after application of the second inspection signal; and anomaly determination step of determining whether or not the piezoelectric element is anomalous on the basis of a value corresponding to the difference between the measured second characteristic value and the measured first characteristic value, wherein the electrical characteristic value measured in the first-characteristic-value measurement step and the second-characteristic-value measurement step includes the loss and resonance frequency of the piezoelectric element;

the anomaly determination step includes obtaining a first determination result, which is a result of determination as to whether or not the piezoelectric element is anomalous performed on the basis of a value corresponding to the difference between a loss measured as the second characteristic value and a loss measured as the first characteristic value, obtaining a second determination result, which is a result of determination as to whether or not the piezoelectric element is anomalous performed on the basis of a value corresponding to the difference between a resonance frequency measured as the second characteristic value and a resonance frequency measured as the first characteristic value, and determining whether or not the piezoelectric element is anomalous on the basis of the first and second determination results, and wherein the first-characteristic-value measurement step is a step of measuring the loss of the piezoelectric element after measurement of the resonance frequency of the piezoelectric element, and the second-characteristic-value measurement step is a step of measuring the loss of the piezoelectric element after measurement of the resonance frequency of the piezoelectric element.

16. An inspection method according to claim 15, wherein the measurement of the resonance frequency of the piezoelectric element in the first-characteristic-value measurement step and in the second-characteristic-value measurement step is performed while vibrating the piezoelectric element at different frequencies from a lower limit frequency to an upper limit frequency of a predetermined frequency range.

17. An inspection apparatus for a piezoelectric element for determining whether or not the piezoelectric element is anomalous, the apparatus comprising:

first-inspection-signal application means for applying to the piezoelectric element a first inspection signal having a first predetermined voltage waveform;

first-characteristic-value measurement means for measuring, as a first characteristic value, an electrical characteristic value of the piezoelectric element after application of the first inspection signal;

second-inspection-signal application means for applying to the piezoelectric element a second inspection signal having a second predetermined voltage waveform and an electrical power greater than that of the first inspection signal;

second-characteristic-value measurement means for measuring, as a second characteristic value, the electrical characteristic value of the piezoelectric element after application of the second inspection signal; and anomaly determination means for determining whether or not the piezoelectric element is anomalous on the basis of a value corresponding to the difference between the measured second characteristic value and the measured first characteristic value, the electrical characteristic value measured in the first-characteristic-value measurement step and the second-characteristic-value measurement step includes the loss and resonance frequency of the piezoelectric element; and the anomaly determination step includes obtaining a first determination result, which is a result of determination as to whether or not the piezoelectric element is anomalous performed on the basis of a value corresponding to the difference between a loss measured as the second characteristic value and a loss measured as the first characteristic value, obtaining a second determination result, which is a result of determination as to whether or not the piezoelectric element is anomalous performed on the basis of a value corresponding to the difference between a resonance frequency measured as the second characteristic value and a resonance frequency measured as the first characteristic value, and determining whether or not the piezoelectric element is anomalous on the basis of the first and second determination results, and wherein the first-characteristic-value measurement step is a step of measuring the loss of the piezoelectric element after measurement of the resonance frequency of the piezoelectric element, and the second-characteristic-value measurement step is a step of measuring the loss of the piezoelectric element after measurement of the resonance frequency of the piezoelectric element.

18. An inspection apparatus according to claim 17, further comprising a resistor which is connected to the piezoelectric element in order to discharge charge from the piezoelectric element after the first-inspection-signal application means has applied the first inspection signal but before the first-characteristic-value measurement means measures the electrical characteristic value as the first characteristic value, and which is connected in order to discharge charge from the piezoelectric element after the second-inspection-signal application means has applied the second inspection signal but before the second-characteristic-value measurement means measures the electrical characteristic value as the second characteristic value.

19. An inspection method according to claim 17, wherein the measurement of the resonance frequency of the piezoelectric element in the first-characteristic-value measurement step and in the second-characteristic-value measurement step is performed while vibrating the piezoelectric element at different frequencies from a lower limit frequency to an upper limit frequency of a predetermined frequency range.

20. An inspection method for a piezoelectric element for determining whether or not the piezoelectric element is anomalous, the method comprising at least:

first-inspection-signal application step of applying to the piezoelectric element a first inspection signal having a first predetermined voltage waveform, said first inspection signal causing the piezoelectric element to be polarized;

wherein the first inspection signal application step comprises the step of polarizing the piezoelectric element by applying a pulse shaped voltage to the piezoelectric element a plurality of times, wherein the step of polarizing the piezoelectric element is a step of gradually increasing the magnitude of the pulse shaped voltage as the number of times of application of the pulse shaped voltage increases; first-characteristic-value measurement step of measuring, as a first characteristic value, an electrical characteristic value of the piezoelectric element after application of the first inspection signal;

second-inspection-signal application step of applying to the piezoelectric element a second inspection signal having a second predetermined voltage waveform and an electrical power greater than that of the first inspection signal, said second inspection signal causing the piezoelectric element to be further polarized;

second-characteristic-value measurement step of measuring, as a second characteristic value, the electrical characteristic value of the piezoelectric element after application of the second inspection signal; and anomaly determination step of determining whether or not the piezoelectric element is anomalous on the basis of a value corresponding to the difference between the measured second characteristic value and the measured first characteristic value.

\* \* \* \* \*